(12) United States Patent
Punzalan et al.

(10) Patent No.: US 12,100,719 B2
(45) Date of Patent: Sep. 24, 2024

(54) RELIABLE SEMICONDUCTOR PACKAGES

(71) Applicant: UTAC Headquarters Pte. Ltd., Singapore (SG)

(72) Inventors: Jeffrey Punzalan, Singapore (SG); Il Kwon Shim, Singapore (SG)

(73) Assignee: UTAC Headquarters Pte Ltd., Singapore (SG)

( * ) Notice: Subject to any disclaimer, the term of this patent is extended or adjusted under 35 U.S.C. 154(b) by 500 days.

(21) Appl. No.: 17/352,348

(22) Filed: Jun. 20, 2021

(65) Prior Publication Data

US 2021/0399035 A1 Dec. 23, 2021

Related U.S. Application Data

(60) Provisional application No. 63/042,014, filed on Jun. 22, 2020.

(51) Int. Cl.
*H01L 27/146* (2006.01)

(52) U.S. Cl.
CPC .. *H01L 27/14618* (2013.01); *H01L 27/14683* (2013.01)

(58) Field of Classification Search
CPC ............... H01L 27/14618; H01L 27/14683
See application file for complete search history.

(56) References Cited

U.S. PATENT DOCUMENTS

| 9,159,637 | B2 | 10/2015 | Feyh et al. | |
| 2007/0291216 | A1* | 12/2007 | Chan | G02F 1/1339 349/110 |
| 2010/0208132 | A1* | 8/2010 | Shiraishi | H01L 31/0203 348/374 |
| 2013/0193545 | A1* | 8/2013 | Jeong | H01L 27/14618 257/443 |
| 2019/0172864 | A1* | 6/2019 | Hsu | H01L 27/14618 |

\* cited by examiner

*Primary Examiner* — Jonathan Han
(74) *Attorney, Agent, or Firm* — HORIZON IP PTE LTD.

(57) ABSTRACT

A semiconductor package and method for forming thereof are disclosed. The package includes a package substrate having a die region with a die attached thereto. An encapsulant is disposed to cover encapsulation region of the package substrate. A protective cover is disposed over the die and attached to the encapsulant by a cover adhesive. The protective cover is supported by a lower portion of step shaped inner encapsulant sidewalls.

20 Claims, 25 Drawing Sheets

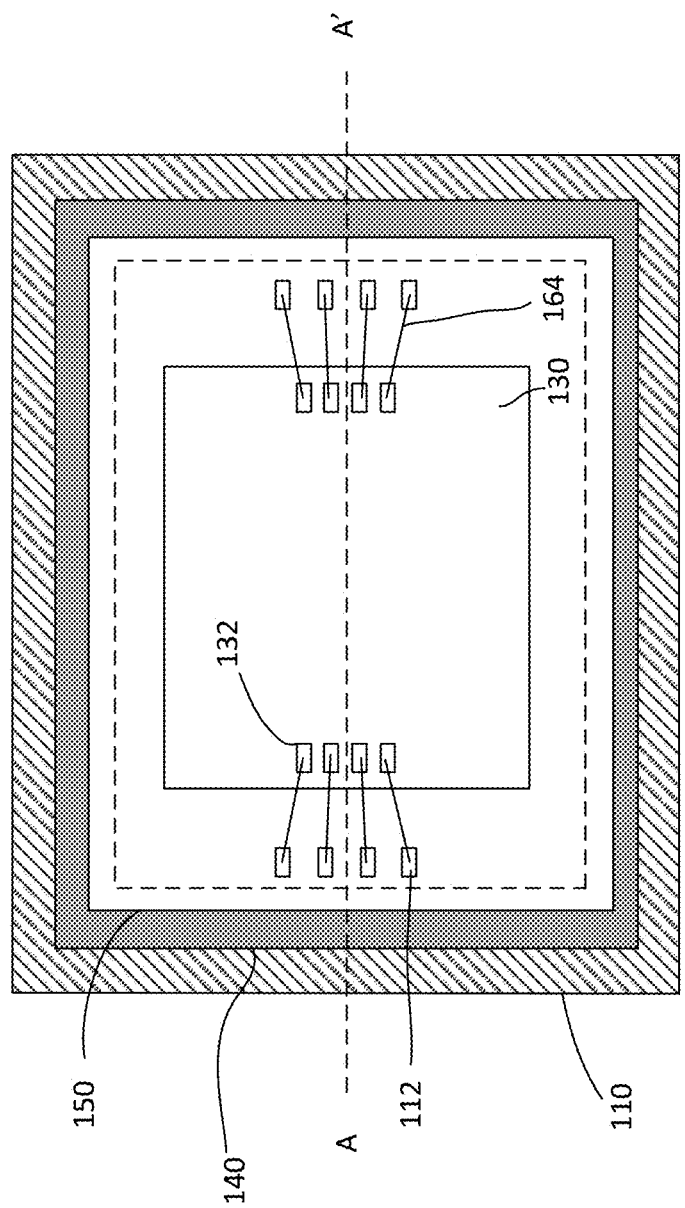

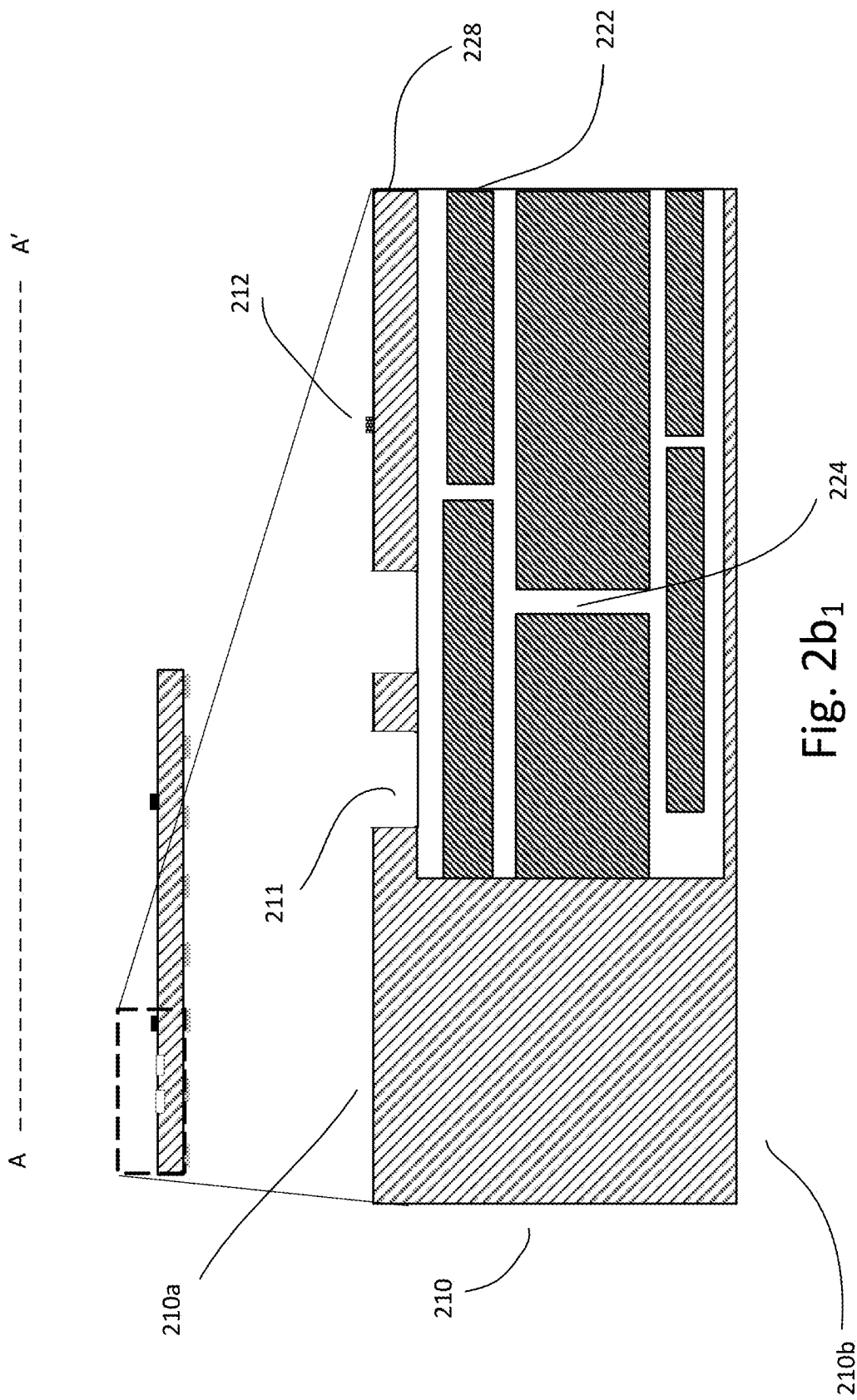

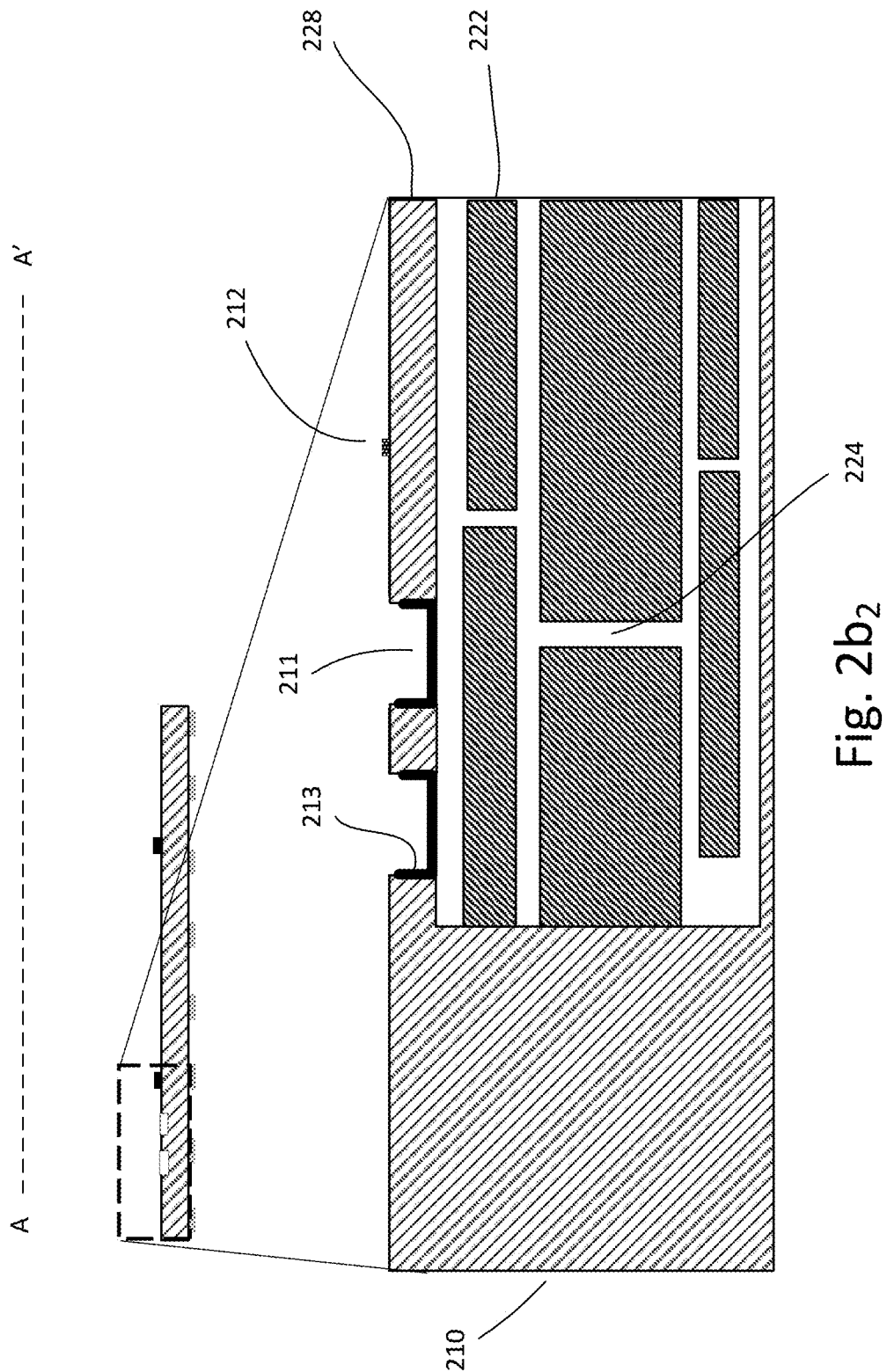

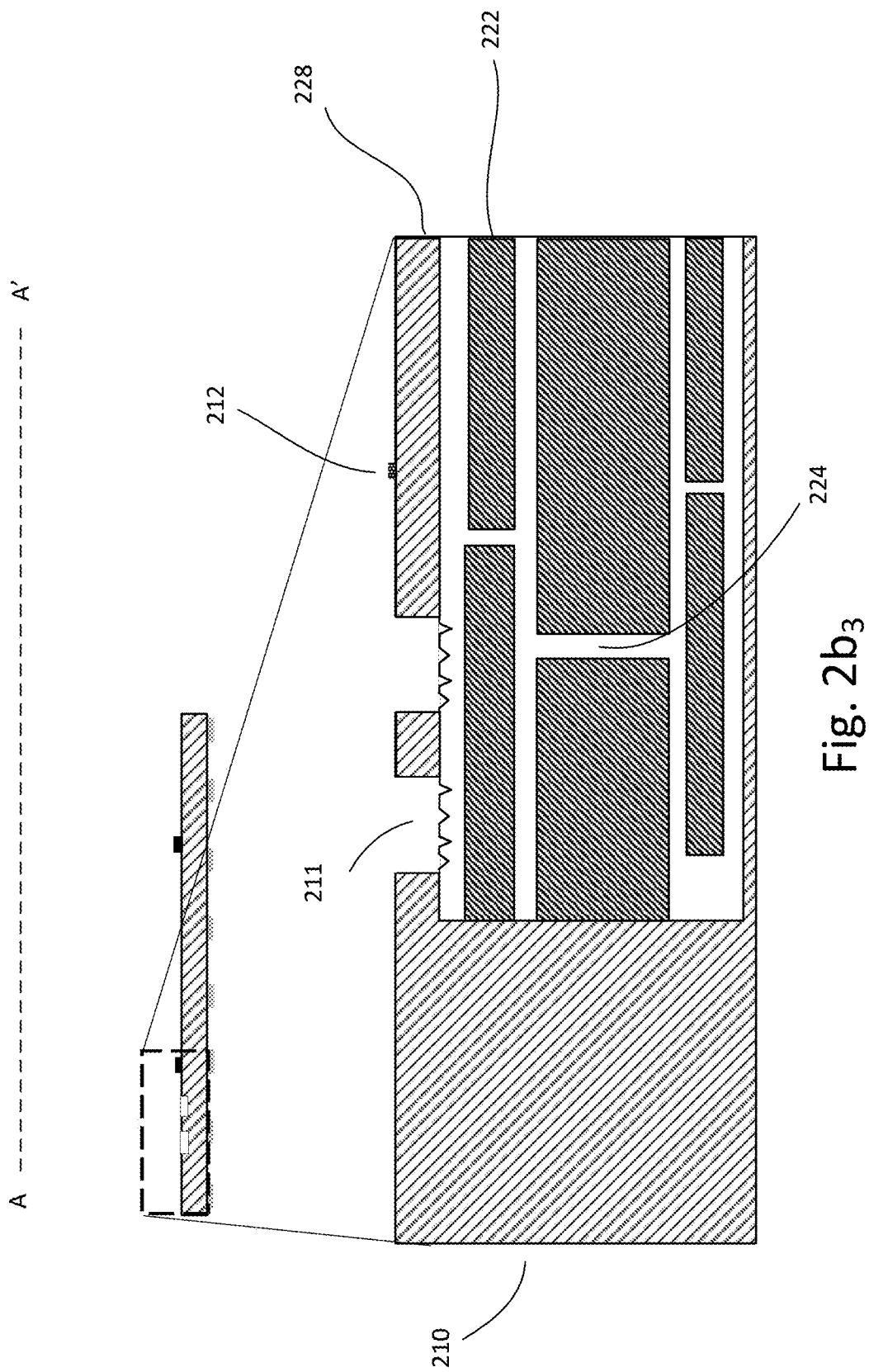
Fig. 2b₃

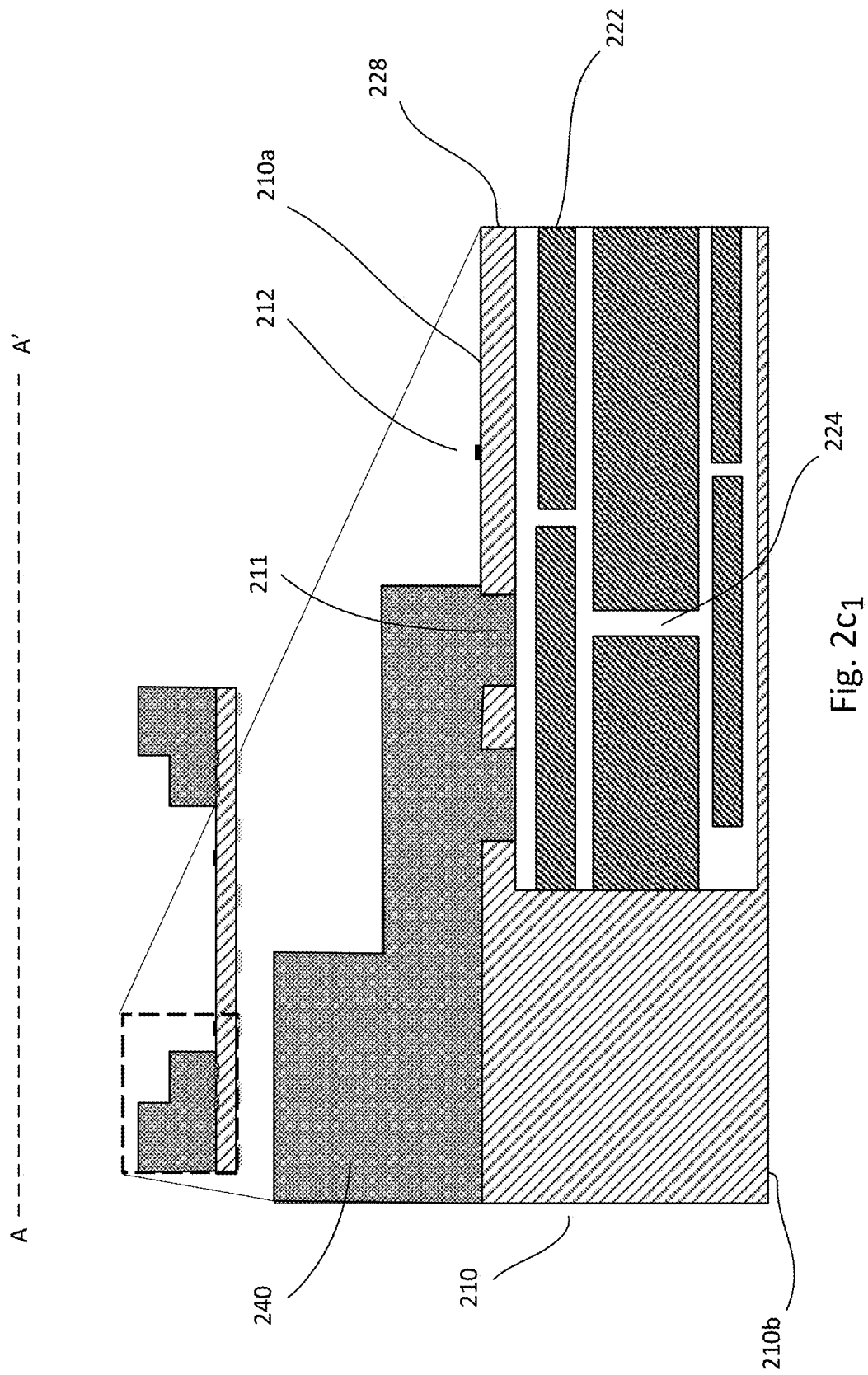

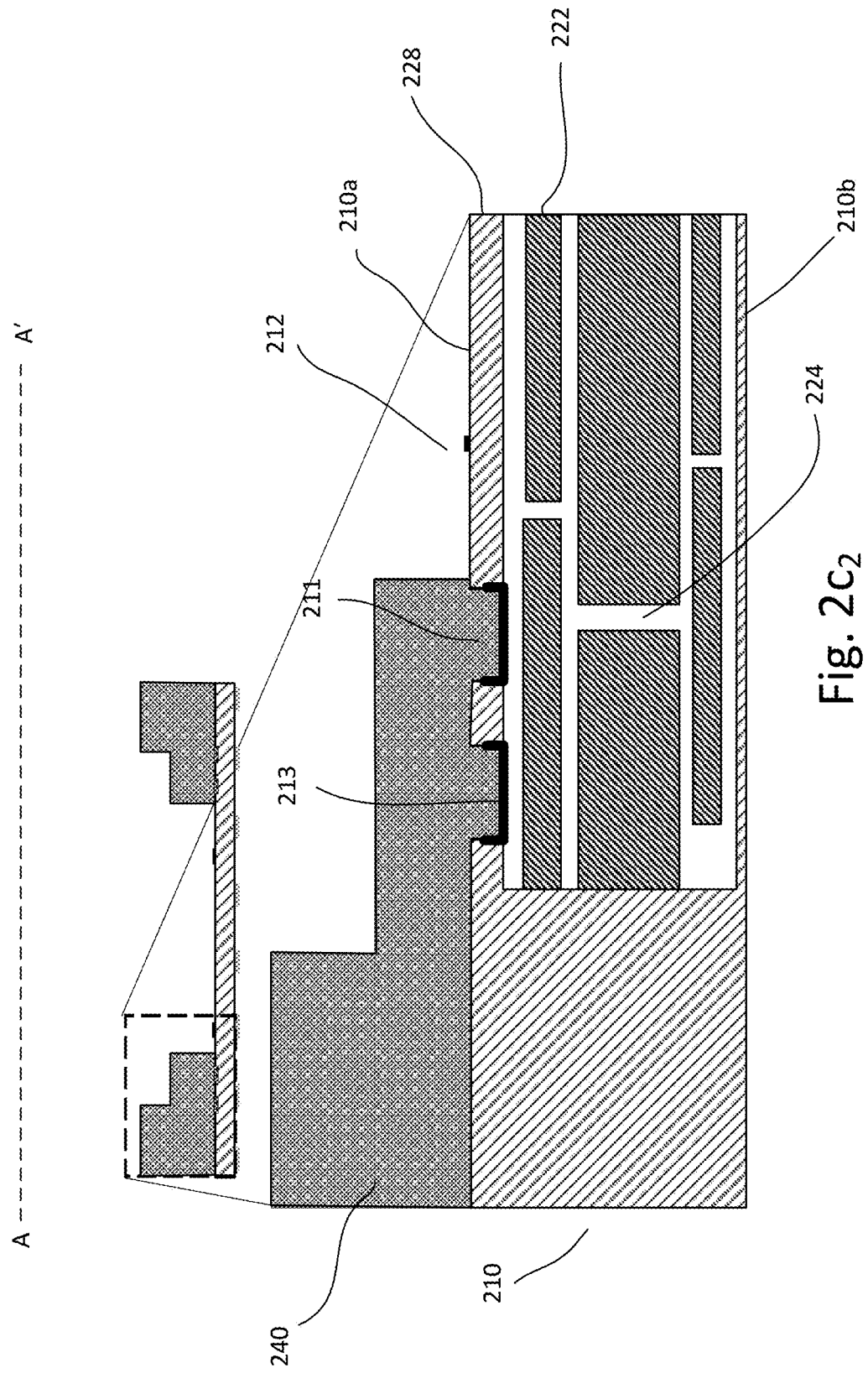
Fig. 2c₂

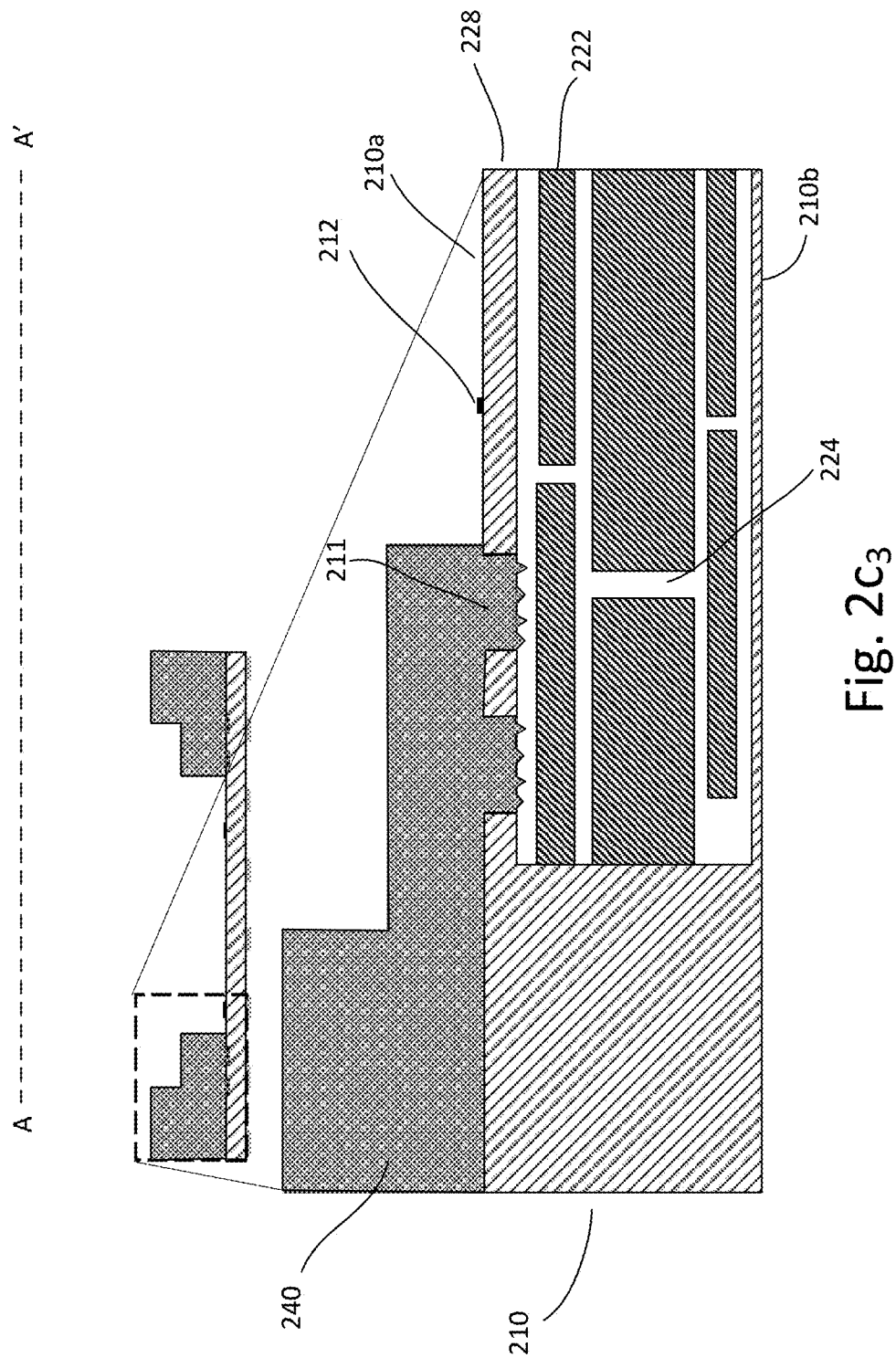
Fig. 2c₃

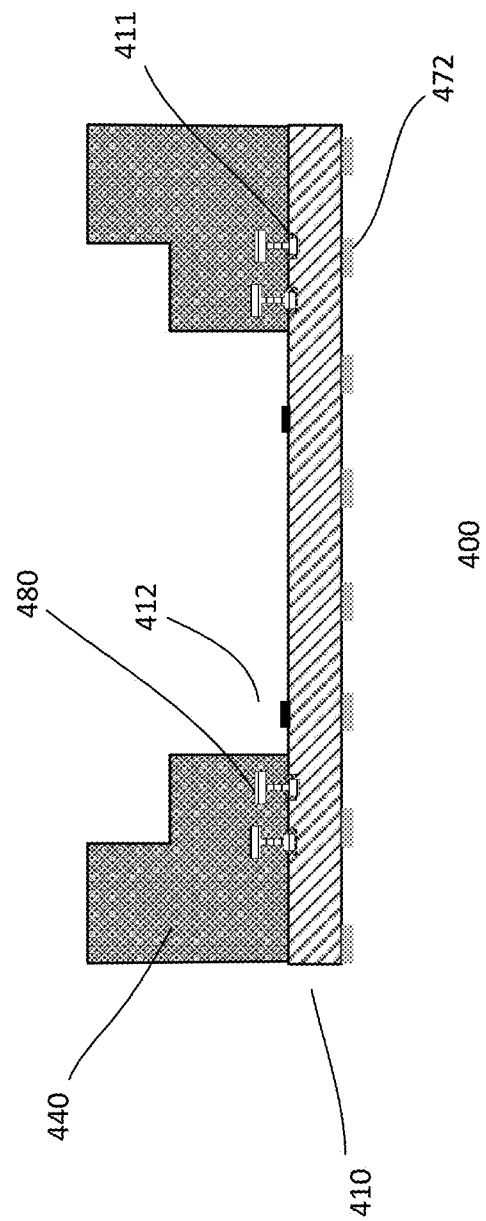
Fig. 4a₁

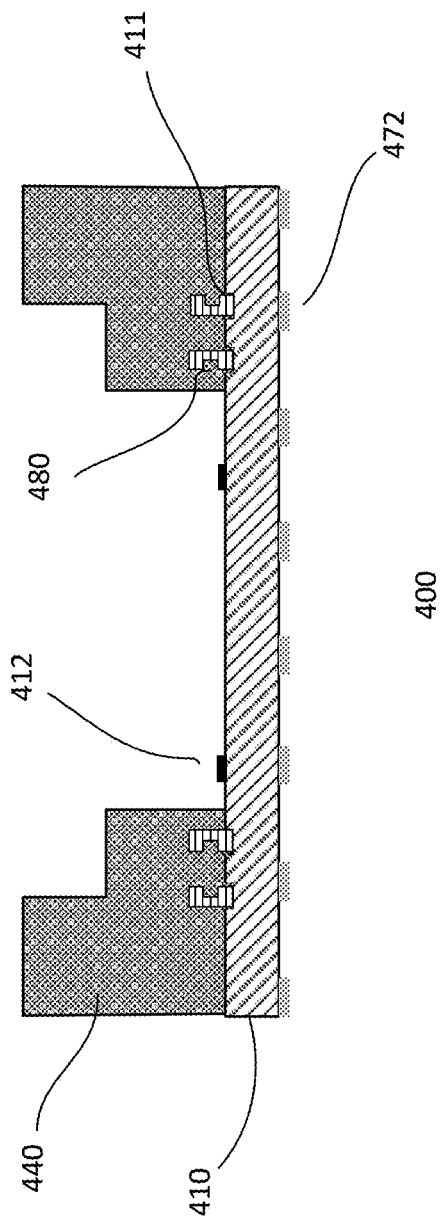
Fig. 4a₂

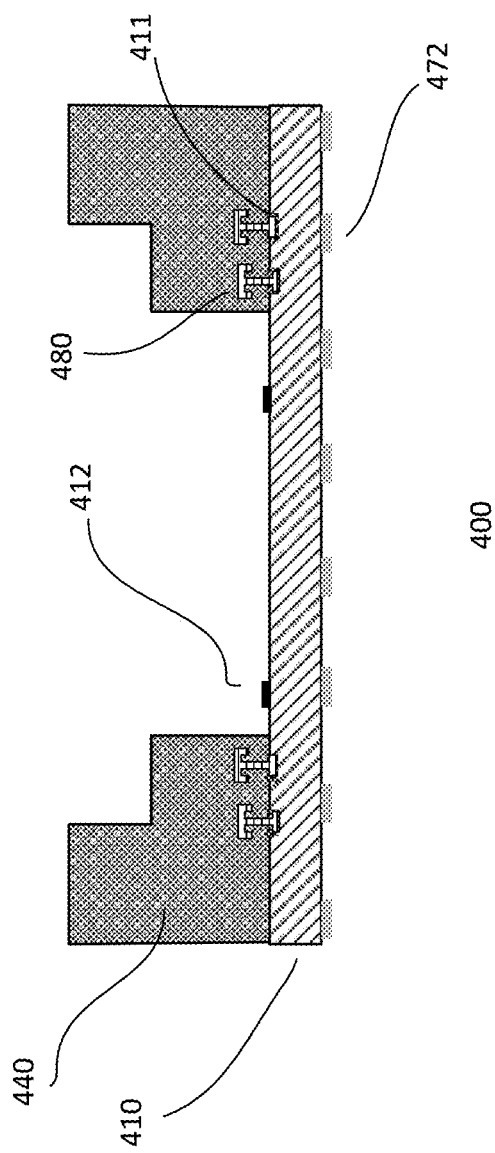

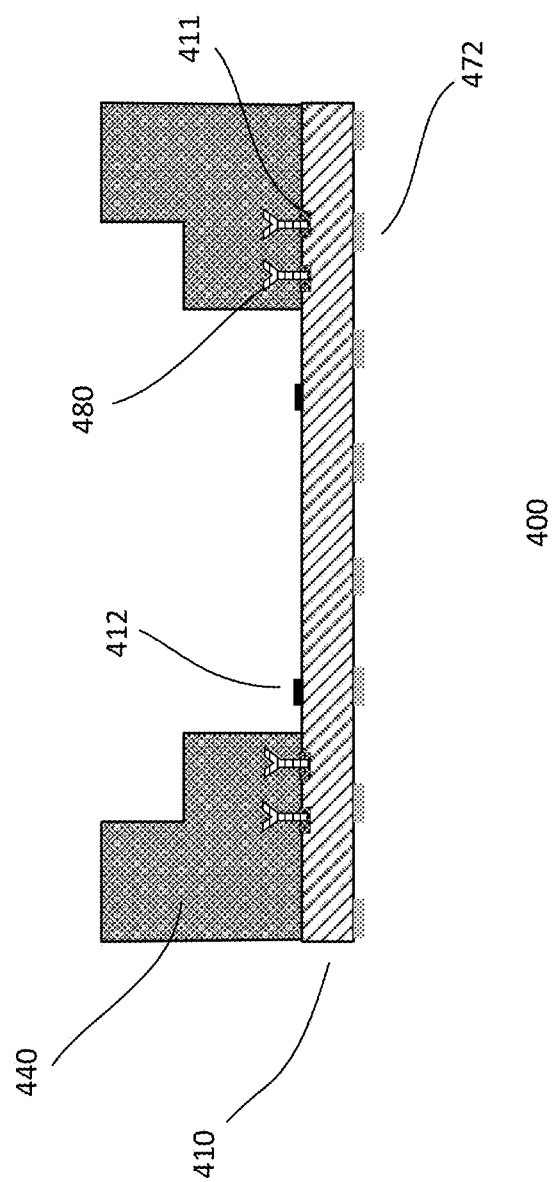

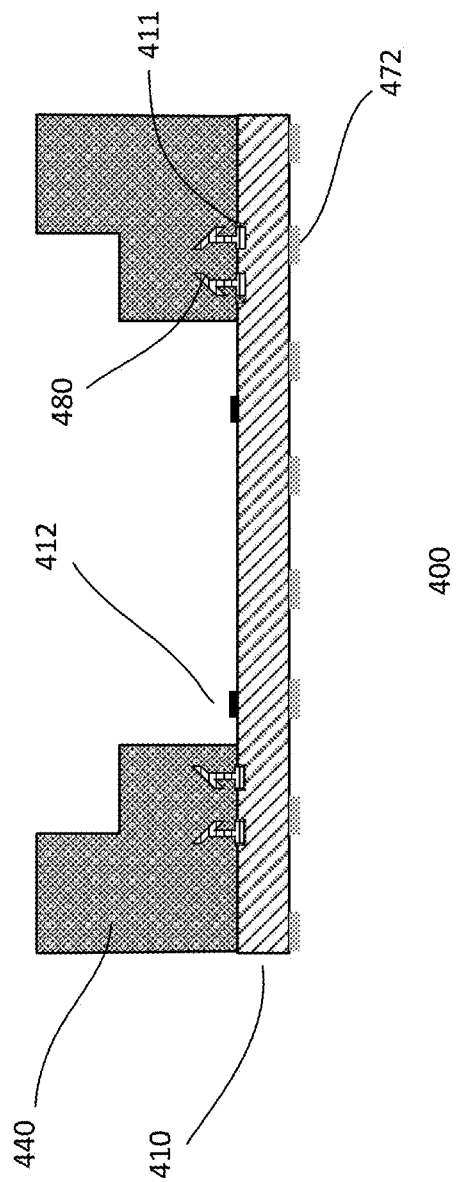
Fig. 4a₅

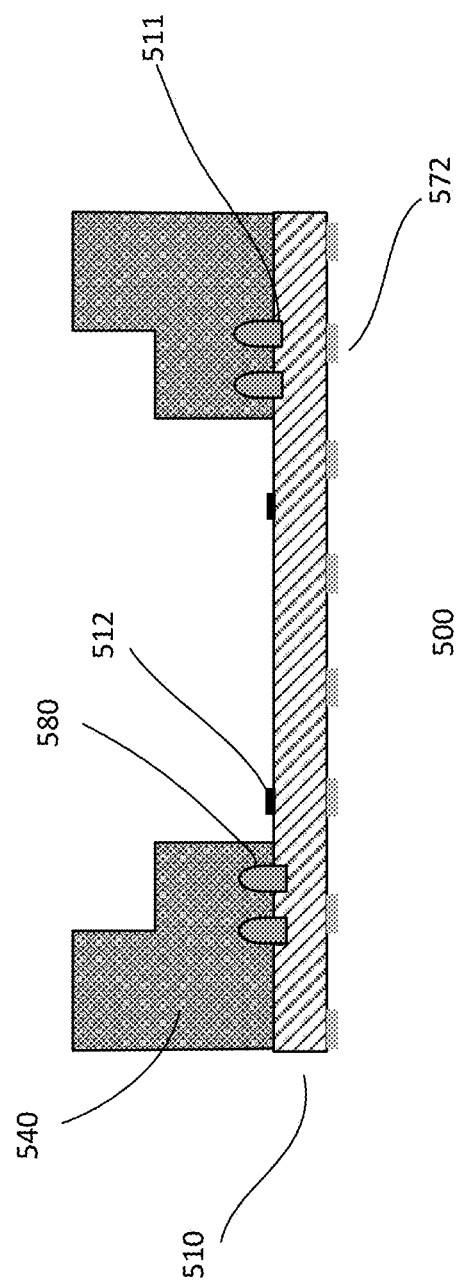
Fig. 5a₁

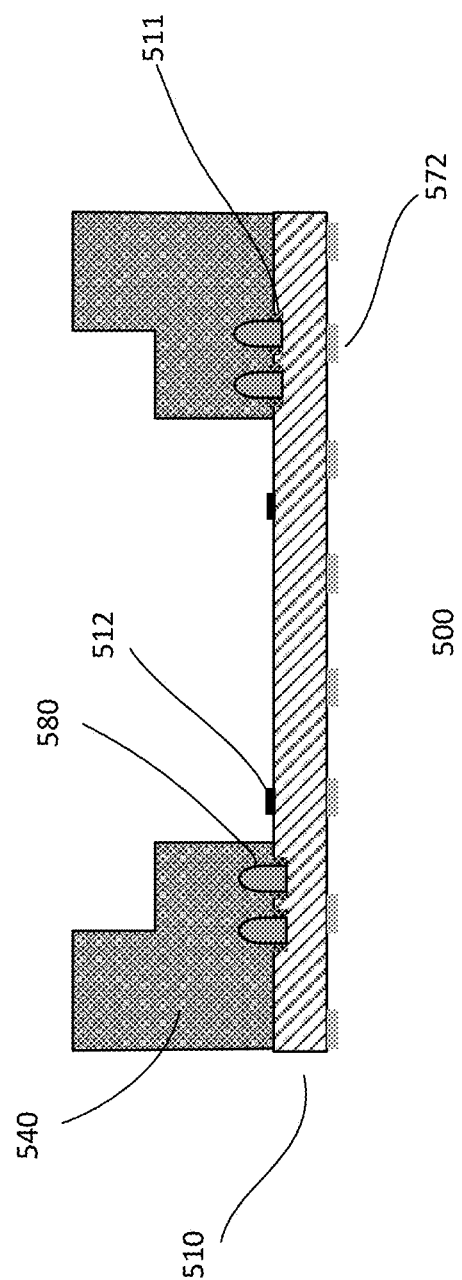
Fig. 5a$_2$

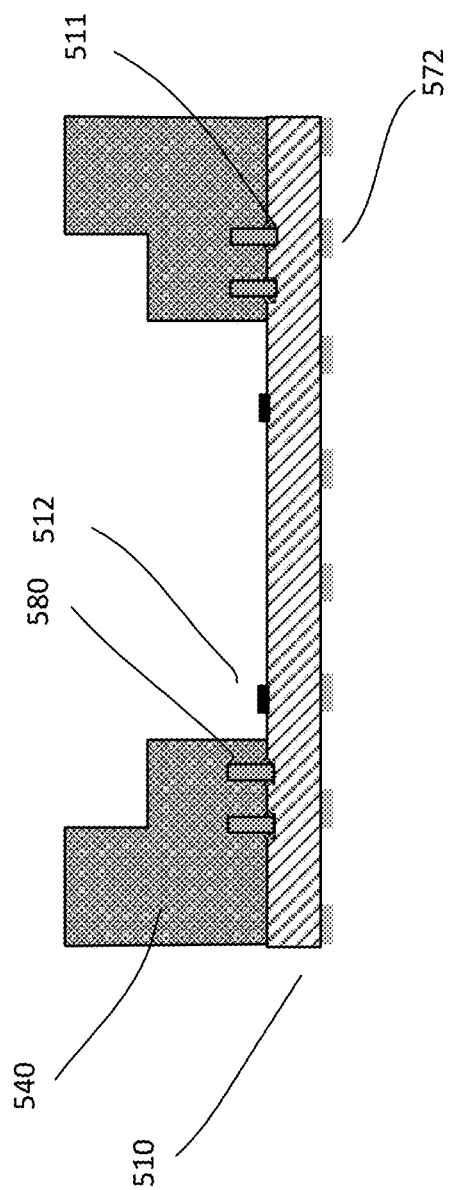
Fig. 5a₃

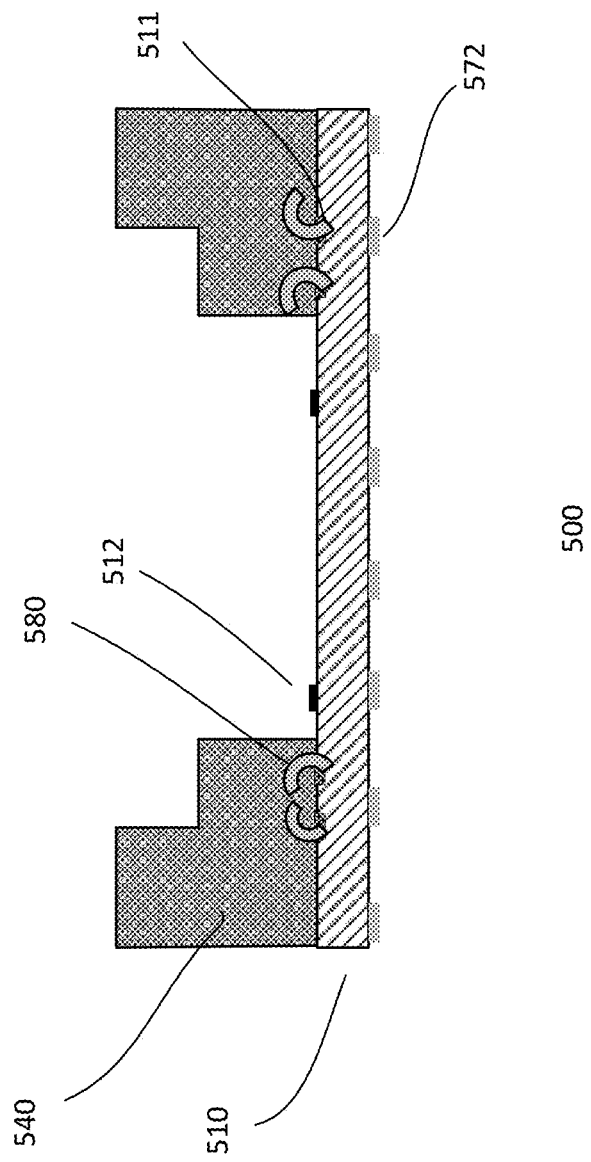
Fig. 5a₄

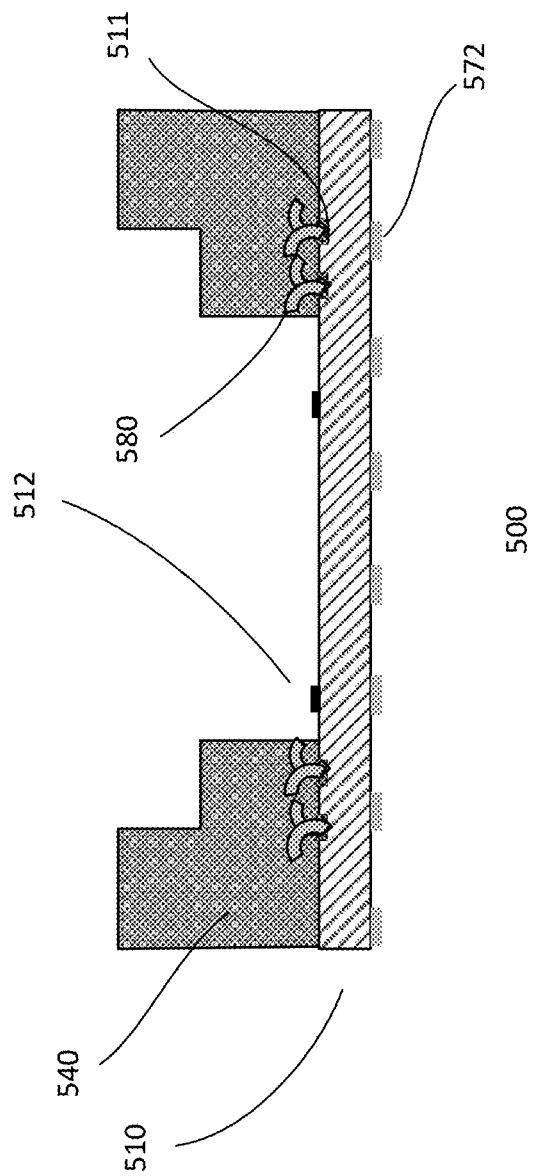
Fig. 5a₅

RELIABLE SEMICONDUCTOR PACKAGES

CROSS-REFERENCE TO RELATED APPLICATION

This application claims the benefit of U.S. Provisional Application No. 63/042,014, filed on Jun. 22, 2020, which is incorporated herein by reference in its entirety for all purposes.

FIELD OF THE INVENTION

The present disclosure relates to semiconductor packages and manufacturing methods of such packages. In particular, the present disclosure relates to semiconductor packages for sensor chips. More specifically, the present disclosure relates to semiconductor packages for image sensor chips.

BACKGROUND

Sensing devices generally include sensor chips used for receiving non-electrical signals from the surrounding environment. A sensor chip converts the non-electrical signals received into electrical signals that are transmitted to a printed circuit board. For example, an image sensor chip converts incoming light into an electrical signal that can be viewed, analyzed, or stored. Image sensors may be used in electronic imaging devices of both analog and digital types, which include digital cameras, camera modules and medical imaging equipment. Most commonly used image sensors may include semiconductor charge-coupled devices (CCD) or active pixel sensors in complementary metal-oxide-semiconductor (CMOS) or N-type metal-oxide-semiconductor (NMOS, Live MOS) technologies.

Typically, a transparent cover is provided over the sensor area of the image sensor die. For example, the transparent cover forms a cavity over the sensor area. The cover permits light to reach the optically active area of the die while also protecting the die from the environment. To form the cavity, an encapsulant, such as epoxy, is provided on a package substrate on which the die is mounted. The encapsulant surrounds the die, forming an epoxy cavity. The glass cover is mounted onto the encapsulant to form a sealed cavity over the die. The epoxy cavity is typically formed separately and attached to the package substrate using an adhesive. However, we have observed delamination of the encapsulant from the package substrate occurs in conventional packages, negatively impacting package reliability.

From the foregoing discussion, there is a desire to provide a reliable cavity package.

SUMMARY

Embodiments generally relate to semiconductor packages and methods for forming semiconductor packages.

In one embodiment, a method for forming a semiconductor package is disclosed. The method includes providing a package substrate having top and bottom major package substrate surfaces. The top major package substrate surface includes a die region and an encapsulation region surrounding the die region with a gap between the die region and the encapsulation region. The method further includes forming one or more cavity interlocks within the encapsulation region. The one or more cavity interlocks are configured to improve the adhesion of the encapsulant to the package substrate. The method further includes depositing an encapsulant on the encapsulation region. The encapsulant includes first and second major encapsulant surfaces and inner sidewalls with a step profile. The second major encapsulant surface adheres to the top major package substrate surface. The encapsulant covers the encapsulation region and forms a cavity structure. The method further includes attaching a die on the die region. The die includes first and second major die surfaces, the second major die surface is attached to the die region. The method further includes attaching a protective cover on the step of the cavity structure. The protective cover and the cavity structure form a hermetic cavity with a predetermined cavity height over the die.

In another embodiment, a semiconductor package is disclosed. The semiconductor package includes a package substrate having top and bottom major package substrate surfaces. The top major package substrate surface includes a die region and an encapsulation region surrounding the die region with a gap between the die region and the encapsulation region. The encapsulation region includes one or more cavity interlocks configured to improve the adhesion of the encapsulant to the package substrate. The semiconductor package also includes a die disposed on the die region. The die includes first and second major die surfaces, the second major die surface is attached to the die region. The semiconductor package also includes an encapsulant disposed on the encapsulation region. The encapsulant includes first and second major encapsulant surfaces and inner sidewalls with a step profile. The second major encapsulant surface adheres to the top major package substrate surface. The encapsulant covers the encapsulation region and forms a cavity structure. The semiconductor package further includes a protective cover disposed on the step of the cavity structure. The protective cover and the cavity structure form a hermetic cavity with a predetermined cavity height over the die.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following, in which:

FIGS. 1a to 1b show simplified top and cross-sectional views of an embodiment of a semiconductor package;

Figure 3A:
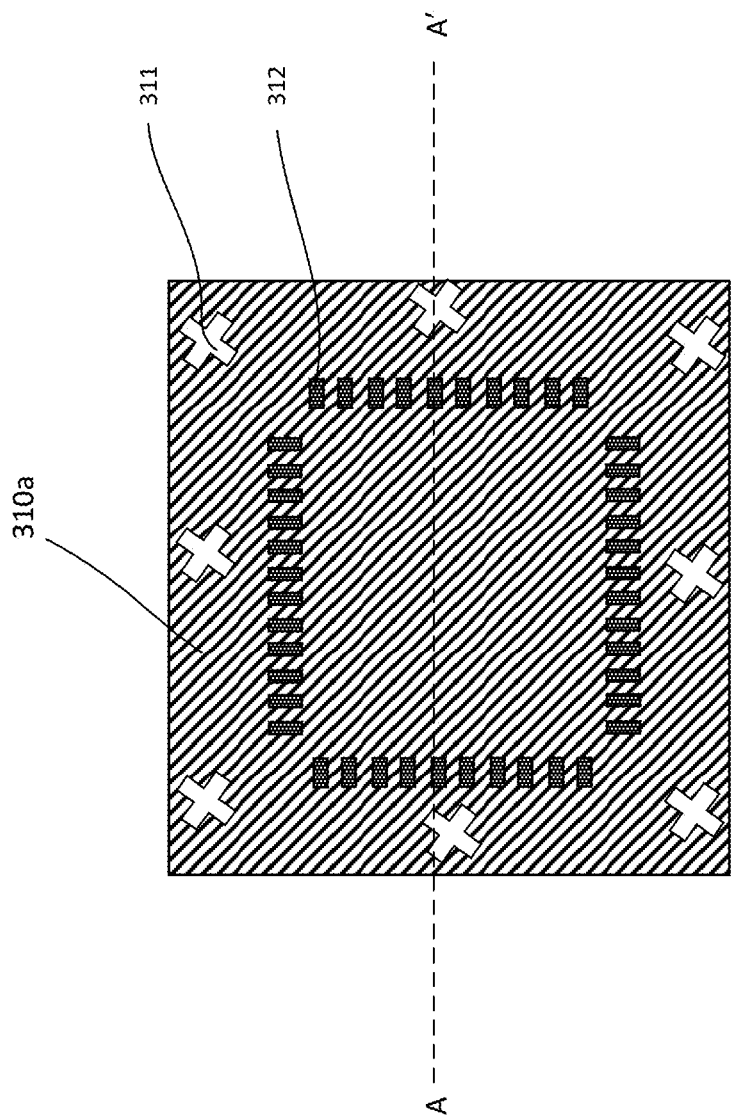
Figure 3B:
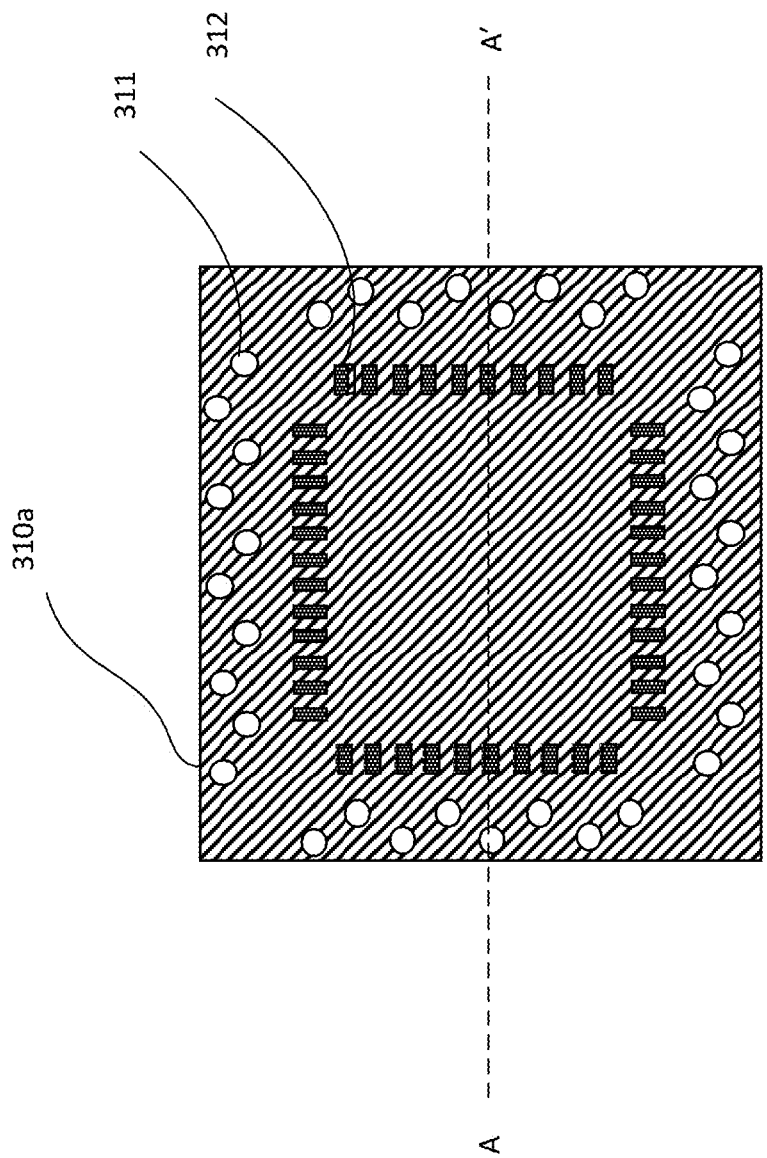
Figure 3C:
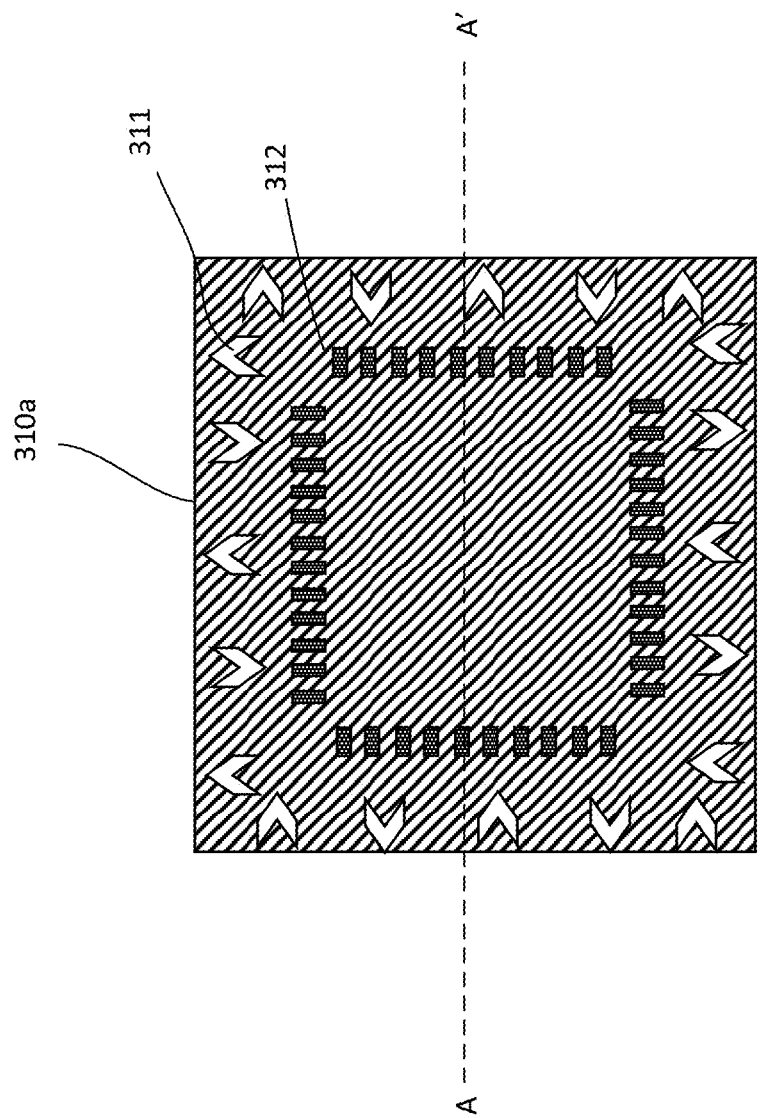
Figure 6A:
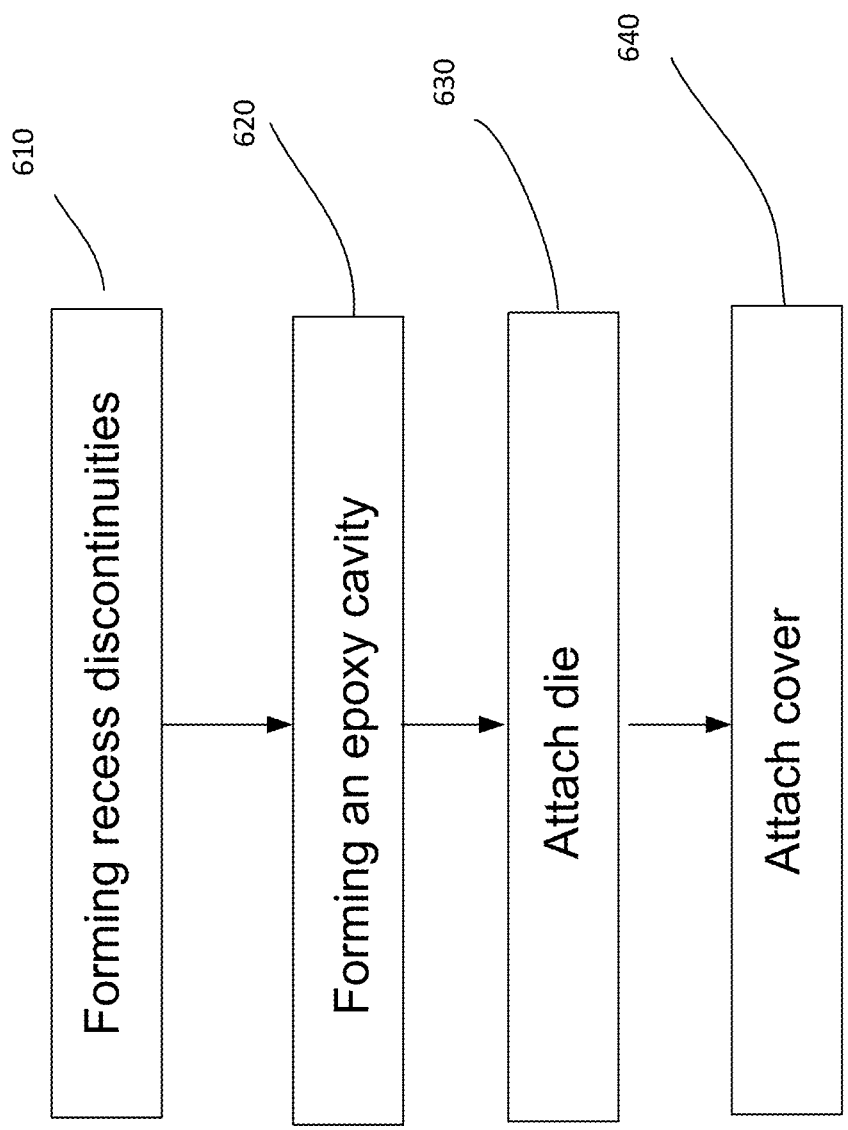
Figure 6B:
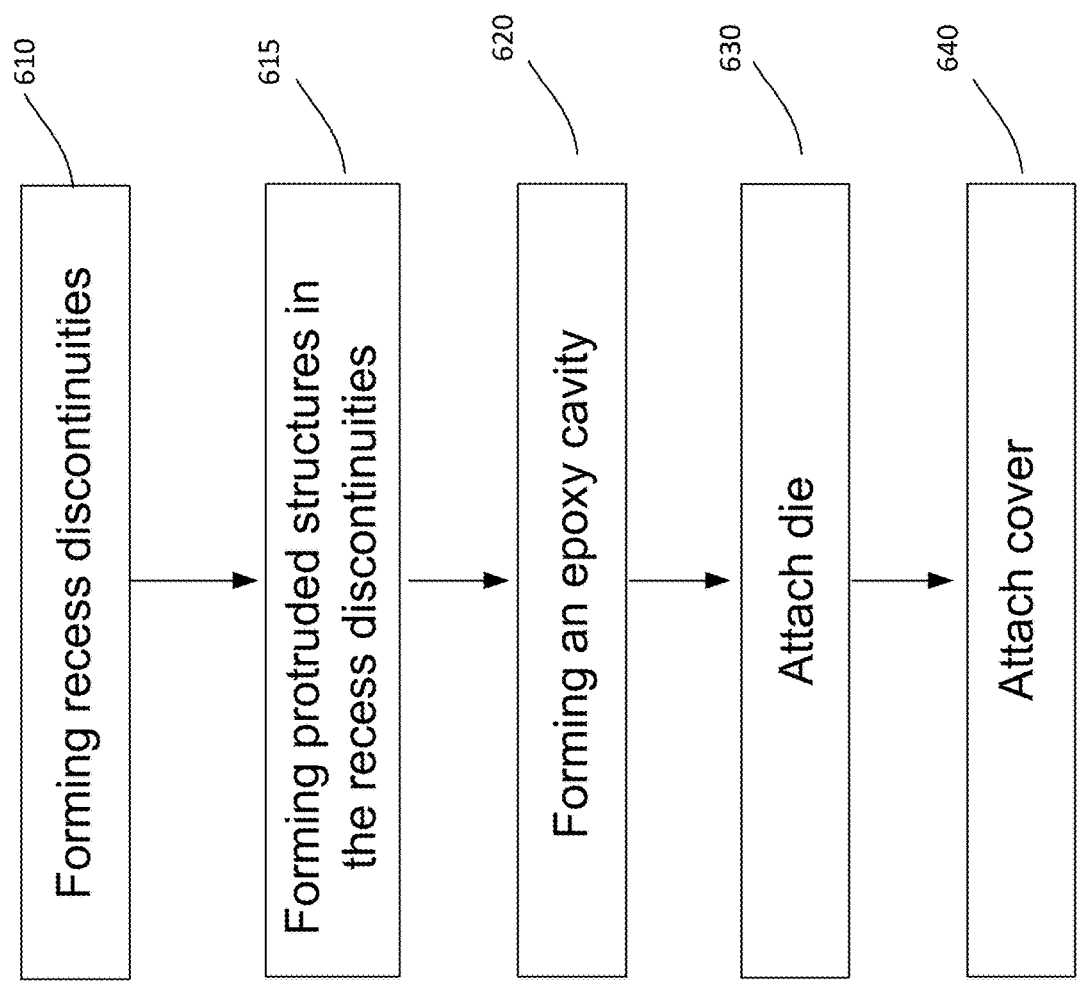

FIGS. $2b_1$ to $2b_3$ show simplified cross-sectional views of various embodiments of a portion of a package substrate with recess discontinuities;

FIGS. $2c_1$ to $2c_3$ show simplified cross-sectional views of exemplary embodiments of a portion of a package substrate with a cavity structure;

FIGS. 3a to 3c show top views of various embodiments of a package substrate formed with discrete recess discontinuities;

FIGS. 4a₁ to 4a₅ show simplified cross-sectional views of various embodiments of a cavity package with protruded discontinuities;

FIGS. 5a₁ to 5a₅ show simplified cross-sectional views of other embodiments of a cavity package with protruded discontinuities; and FIGS. 6a to 6b show process flows of forming various embodiments of a semiconductor package.

DETAILED DESCRIPTION

Embodiments described herein generally relate to semiconductor packages and methods for forming such semiconductor packages. In some embodiments, the semiconductor package is a cavity package for a sensor chip used in, for example, sensing environmental signals, such as optical signals or audio signals. The semiconductor package includes an epoxy cavity with a protective cover over the sensor chip. The semiconductor package may include other types of chips with a cover thereover. The semiconductor package may be incorporated into electronic devices or equipment, such as sensing devices, navigation devices, telecommunication devices, computers and smart devices.

Figure 1B:
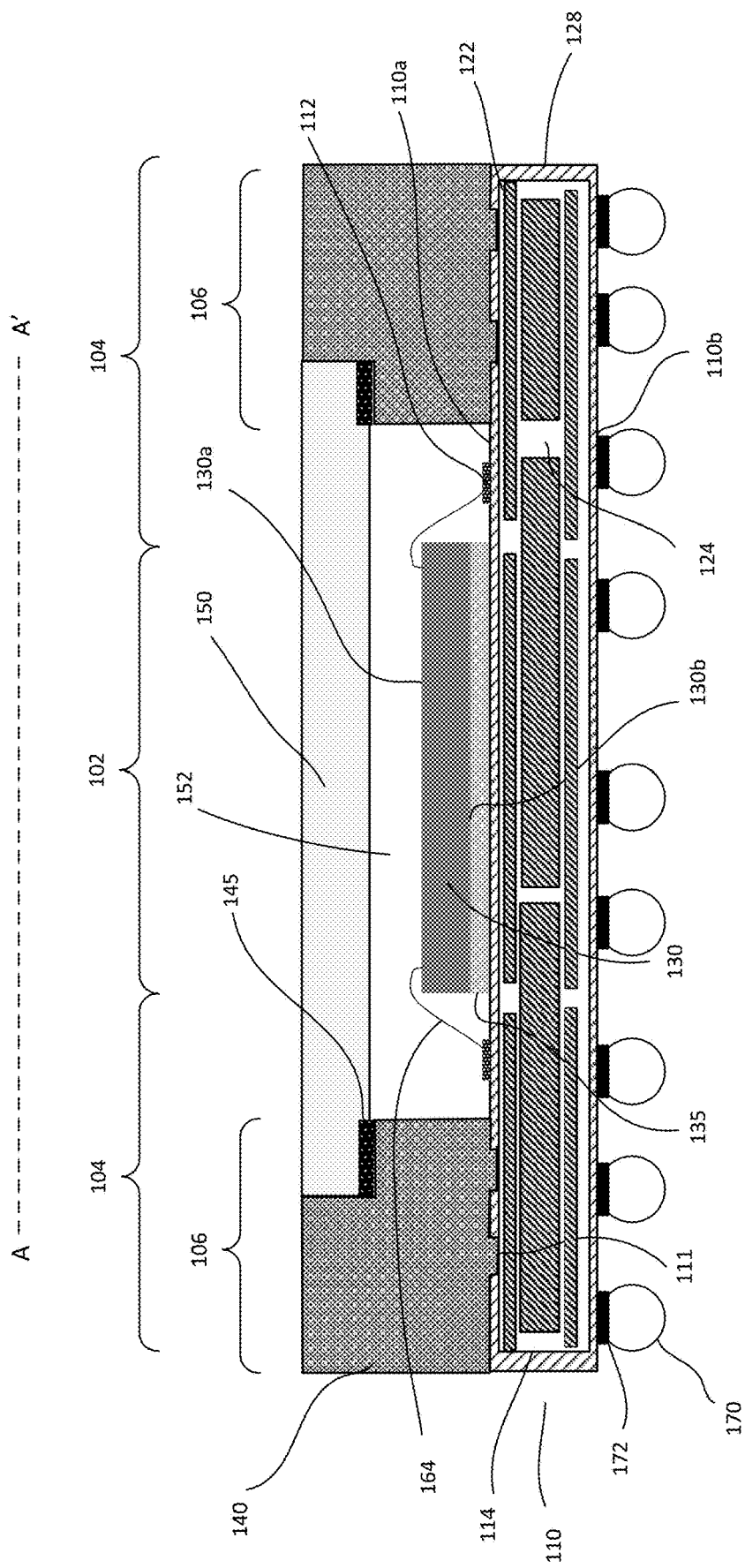

FIGS. 1a to 1b show simplified top and cross-sectional views of an embodiment of a semiconductor package 100. In particular, FIG. 1a shows a top view of a semiconductor package 100; FIG. 1b shows a cross-sectional view taken along A-A of the semiconductor package 100.

Referring to FIGS. 1a to 1b, the semiconductor package 100 includes a package substrate 110 having opposing first and second major surfaces 110a and 110b. The first major surface 110a may be referred to as the top package surface and the second major surface 110b may be referred to as the bottom package surface. Other designations for the surfaces may also be useful.

The package substrate 110, in one embodiment, is a laminate package substrate. Other types of package substrates may also be useful. The package substrate includes a core package substrate 114 having a layered stack. The layered stack, for example, includes patterned metal layers 122 forming metal traces separated by dielectric layers 124. Metal traces of adjacent metal layers may be interconnected by via contacts disposed in the dielectric layers. The layered stack may include metal layers as the top and bottom layers. In the case that the layered stack includes more than two patterned metal layers, other patterned layers may be referred to as intermediate patterned metal layers. As shown, the layered stack includes five patterned metal layers and three dielectric layers, with the top and bottom layers being patterned metal layers. Other configurations of the core substrate may also be useful.

The core substrate, in one embodiment, is encased by a solder mask 128. For example, the solder mask is disposed on the top and bottom patterned metal layers and sides of the core substrate. The solder mask, for example, is a polymer solder mask. Other types of solder masks may also be useful. The first package surface is defined by a first solder mask surface and the second package surface is defined by a second solder mask surface. For example, the top package surface is defined by the top solder mask surface and the bottom package surface is defined by the bottom solder surface. The top package surface may serve as a die bonding surface with a die region on which a die 130 is attached while the bottom package surface may serve as a package bonding surface which is bonded to, for example, an external circuit board.

The top package surface may be defined with a die region 102. Surrounding the die region is a non-die region 104. An encapsulation region 106 is defined in a peripheral portion of the non-die region. For example, the die region may be centrally disposed on the top package surface with the non-die region surrounding it. Providing a die region which is not centrally disposed on the top package surface may also be useful.

The top package surface of the package substrate may include package bond pads 112. In some embodiments, the top package surface of the package substrate includes package bond pads 112 outside of the die region 102. For example, the package bond pads are disposed on the portion of the non-die region 104 between the encapsulation region 106 and the die region 102. The package bond pads are electrically connected to, for example, the metal traces of the top patterned metal layer of the core substrate.

The bottom package surface may include package pads 172. The package pads are electrically connected to, for example, the metal traces of the bottom patterned metal layer of the core substrate. Package contacts 170 are disposed on the package pads. The package contacts, for example, are solder bumps. Other types or configurations of package contacts may also be useful. The package contacts on the bottom package surface are electrically connected to the package bond pads on the top package surface via the metal traces and via contacts of the core package substrate. The package contacts serve as electrical connections to external circuitry, such as a printed circuit board (PCB) or another package, such as a package on a package (PoP).

A die 130 is attached to the die region 102 of the top package surface of the package substrate. The die, for example, includes first and second opposing major die surfaces 130a and 130b. The first major die surface may be referred to as a top or active die surface and the second major die surface may be referred to as a bottom or inactive die surface.

In one embodiment, a die adhesive 135 is employed to attach the die to the die region. The adhesive may be a curable glue or adhesive tape. For example, a curing process may be performed to permanently attach the die to the die region. Other types of die adhesives or techniques for attaching the die to the die region may also be useful. The bottom die surface 130b of the die, for example, faces the package substrate. For example, the die adhesive attaches the inactive die surface to the die region of the package substrate.

In one embodiment, the active die surface 130a includes a sensor region (not shown). For example, the die is a sensor chip. Other types of dies may also be useful. For example, the die may be a thermal or infrared (IR) image sensor chip. Other types of chips, for example, non-sensor chips, may also be useful. In the case of an image sensor chip, the sensor region may include a photosensitive sensor that may capture image information in response to light. The image sensor may be, for example, a CMOS or CCD type image sensor. In one embodiment, the sensor region includes an array of sensors. For example, each sensor may correspond to a pixel of an image. The sensor chip may include CMOS components embedded in the chip for controlling the sensor chip. Other configurations of the sensor chips may also be useful.

The active die surface 130a may include die bond pads disposed outside of the sensor region. For example, the die bond pads may be disposed on the non-sensor region of the active surface of the die. The die bond pads are exposed by openings formed in a top passivation layer of the die. The surface of the die bond pads, for example, is substantially coplanar with the active surface of the die. Providing die bond pads with surfaces which are not coplanar with the active die surface may also be useful. The die bond pads provide outer electrical connections to various components of the die. A conductive material, such as copper (Cu), aluminum (Al), Gold (Au), Silver (Ag), Nickel (Ni), solder material, or the alloys of these materials, or a combination thereof, may be used to form the die bonds pads. Other types of conductive material may also be useful. As shown, the die bond pads may be arranged into one or more rows disposed along the periphery of the active surface of the die. Other arrangements of the die bond pads may also be useful.

In one embodiment, wire bonds 164 are provided to electrically connect the die bond pads 132 on the active surface of the die to the package bond pads 112 on the top package surface of the package substrate. The wire bonds enable outer connection to the inner circuitry of the die. The wire bonds, for example, may be formed of any suitable metal material such as, but not limited to, Cu, Au, Ag, Al, or the alloys of these materials, or a combination thereof. Other types of conductive materials may also be used. The wire bonds 164 create electrical connections between the interconnect structures (e.g., bond pads, conductive traces, via contacts, terminal pads) of the package substrate 110 and the semiconductor die 130.

An encapsulant or cavity structure 140 is disposed on the encapsulation region 106 of the top package surface of the package substrate. The cavity structure covers the encapsulation region of the top package surface of the package substrate. In one embodiment, a bottom surface of the cavity structure is disposed on the package substrate within the defined encapsulation region. As discussed, the encapsulation region leaves a portion of the non-die region exposed between the die region and the inner edges or boundaries of the encapsulation region. For example, the cavity structure surrounds the die region and having a gap in the portion of the non-die region between the encapsulation region and die region. In one embodiment, the cavity structure is configured to form a cavity for the package in which the die is disposed. For example, as shown, outer cavity structure walls of the cavity structure are aligned with sides of the package substrate and inner cavity structure walls of the cavity structure are aligned with the inner edge of the encapsulation region and form the cavity in which the die is disposed. The shape of the cavity, for example, is rectangular. Providing other shaped cavities may also be useful, depending on, for example, the shape of the encapsulate region and the inner cavity structure sidewalls.

In one embodiment, the cavity structure is configured to accommodate a protective cover or cap 150. In one embodiment, the inner cavity structure walls include a stepped profile for accommodating the protective cover. For example, the outer cavity structure sidewalls are vertical sidewalls while the inner sidewalls have vertical lower inner cavity structure sidewalls and vertical upper inner cavity structure sidewalls which are recessed from the lower inner cavity structure sidewalls.

The cavity structure may be formed using a mold compound, such as an epoxy mold compound. Other types of materials for forming the cavity structure may also be useful. The cavity structure may be formed by various techniques, such as compression molding, injection molding, or transfer molding. Other techniques may also be useful. For example, the cavity structure may be performed and attached to the package substrate using a mold compound adhesive or formed directly on the package substrate. The mold compound adhesive, for example, may be a thermal or u-v curable adhesive. Other types of adhesives may also be useful.

The protective cover 150, for example, is disposed on the step of the inner cavity structure sidewalls. The protective cover includes first or top and second or bottom opposing cover surfaces with side surfaces or edges. The bottom cover surface, for example, is facing the die. The protective cover, for example, may be a glass cover which enables light to penetrate to the sensor region. Other types of protective covers may also be useful. For example, the protective cover may depend on the type of sensor. As shown, the top protective cover surface is about coplanar with the top surface of the cavity structure while the side protective layer surfaces abut the upper inner cavity structure sidewalls. Providing other configurations of the protective cover and sidewall profiles of the cavity structure may also be useful.

A cover adhesive may be employed to attach the protective cover to the cavity structure. The cover adhesive is disposed on the step of the cavity structure. The cover adhesive may be a thermal or u-v curable adhesive. For example, a curing process may be performed to permanently attach the cover to the cavity structure, hermetically sealing the cavity to protect the sensor of the die.

In one embodiment, the cavity structure with the protective cover is configured to form a cavity 152 with a predetermined cavity height. For example, the cavity height is the distance between the bottom protective cover surface and the active die surface. The cavity height should be sufficient to protect various components within the cavity. For example, the cavity height should be sufficient to avoid damaging the die and wire bonds in the cavity. The cavity height, for example, may be about 120-150 um. Other cavity heights may also be useful. The height should be sufficient to protect the wire bonds from being damaged.

The encapsulation region 106 of the top package surface includes one or more cavity interlocks 111. Preferably, the package substrate includes a plurality of interlocks. The cavity interlocks are configured to improve the adhesion of the cavity structure to the package substrate 110. For example, the cavity interlocks are configured to prevent delamination of the cavity structure from the package substrate. In one embodiment, an interlock is a discontinuity on the surface of the package substrate. For example, the interlock is a discontinuity on the polymer solder mask 128 encasing the core substrate 114. The discontinuity may be a recessed discontinuity, such as a trench or via which extends below the surface of the package substrate, a protruded discontinuity, such as a structure which protrudes above the surface of the package substrate, or a combination thereof.

Preferably, a recess discontinuity extends to a metal layer of the core substrate. For example, the recess discontinuity extends to a depth of the first or top metal layer of the core substrate. Recess discontinuities may be formed by, for example, patterning the surface of the package substrate. Patterning may be achieved using various techniques, such as laser etching or drilling. Other techniques, including mask and etch techniques, may also be useful. For protruded discontinuities, the protruded structures may be pressed into the surface of the package substrate. As for combination discontinuities, recesses may be formed and protruded structures are pressed into the recesses.

In one embodiment, the cavity interlocks may be discrete discontinuities 111. For example, the discrete discontinuity is an isolated discontinuity. In the case of a discrete recessed discontinuity, an isolated recess may have a rectangular shape, a square shape, or circular shape, or any polygonal-shaped recess. In the case of a discrete protruded discontinuity, the protrusion may include a solder structure, such as a solder bump, a solder bar, a solder hook, multiple solder hooks or any shaped structure. In one embodiment, the protruded discontinuity may include an anchor structure, such as a T-shaped anchor, a Y-shape anchor, a sloped T-shape anchor, or a C-shape anchor. Other types of protruded structures may also be useful. In some embodiments, the discrete discontinuity may include both recessed and protruded. For example, a protruded structure is disposed in a recess to produce a recessed and protruded discrete discontinuity. Furthermore, in the case of a plurality of discrete discontinuities, it is understood that they can be identical or non-identical.

As shown, the cavity interlocks 111 are recessed discontinuities 111. For example, the discontinuities may be discrete trenches or vias distributed throughout the surface of the package substrate within the encapsulation region. The distribution can have any pattern on the package substrate surface. For example, the distribution may have a regular or an irregular pattern. A regular pattern, for example, may include a row of discrete discontinuities on all four sides surrounding the die region 102, multiple rows of discrete discontinuities on all four sides surrounding the die region with aligned or staggered columns while an irregular pattern may include discontinuities arranged in a random distribution pattern. Other distribution patterns for the cavity interlocks may also be useful.

In some cases, a cavity interlock may be configured as a continuous discontinuity. For example, a cavity interlock may be a ringed discontinuity, such as a recessed discontinuity, a ringed protruded discontinuity or a combination thereof, which completely and continuously surrounds the die region 102. This is in contrast to discrete discontinuities which are configured to discontinuously surround the die region. The ringed shape continuous discontinuity may be regular or irregular in shape. For example, regular shapes include circles, ellipses, squares, rectangles, and polygons while irregular shapes may include any odd shaped ring structures. In other embodiments, multiple continuous ring shaped discontinuities may be provided. For example, concentric rings, regular or irregular shaped, may be provided. Furthermore, rings need not have the same shape.

In yet other embodiments, the cavity interlocks may be configured as semi-continuous discontinuities. Semi-continuous discontinuities, in one embodiment, are elongated discontinuities. Similar to discrete discontinuities, they do not continuously surround the die region 102. However, by being elongated, they require fewer discontinuities to surround the die region than discrete discontinuities. The discontinuities may be distributed in any pattern on the surface of the package substrate. In some embodiments, the pattern of the distribution of discontinuities may include discrete discontinuities, semi-continuous discontinuities, continuous discontinuity or discontinuities or a combination thereof.

Figure 1C:
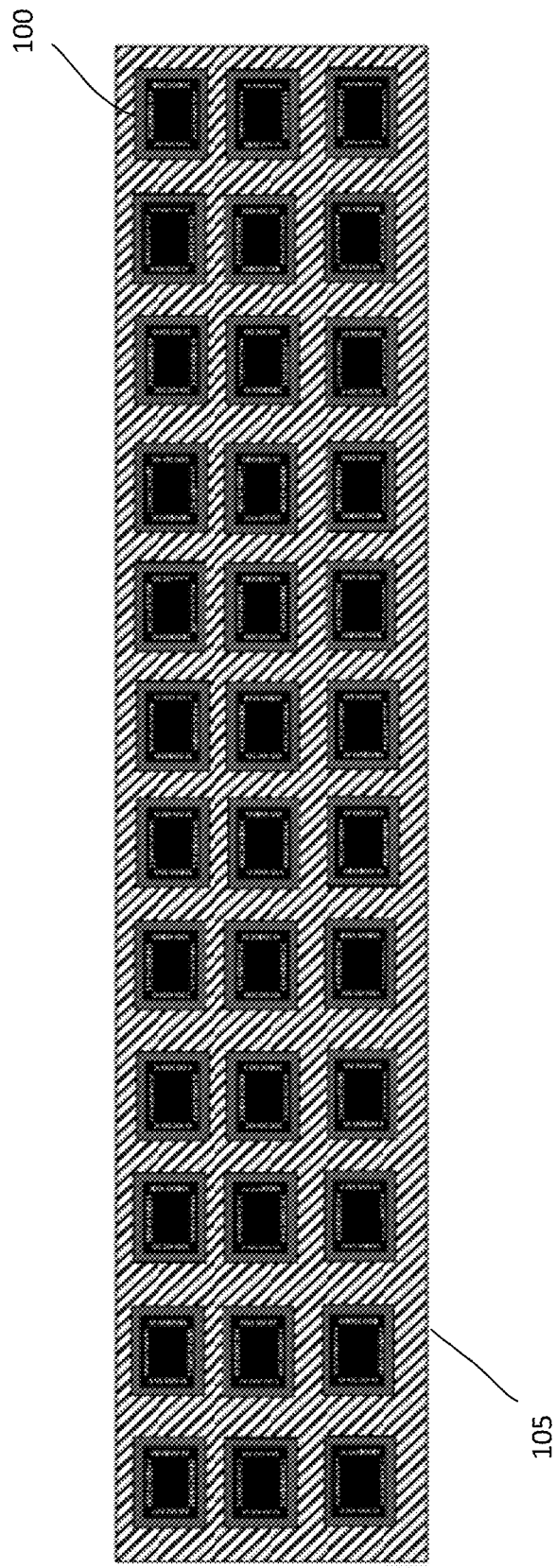
FIG. 1c shows a package substrate strip with a plurality of packages processed in parallel.

FIG. 1c shows a package substrate strip 105. The package substrate strip, for example, serves as a package substrate for processing a plurality of packages 100 in parallel. The package substrate strip may be defined with a plurality of package regions in which packages are processed in parallel. For example, a package region includes a non-die region surrounding the die region. At a peripheral portion of the non-die region is an encapsulation region. On the top surface of the package region of the package substrate strip are package bond pads disposed in the non-die region between the encapsulation region and the die region and package pads are on the bottom surface of the package region of the package substrate strip. Package contacts are formed on the package pads for connecting with external circuitry. The package contacts, for example, are formed solder balls after solder ball mount reflow process.

The package regions are, as shown, arranged in a matrix format. For example, the package regions of the package strip are arranged in rows and columns. The package strip is processed to form packages, such as those described in FIGS. 1a to 1b. For example, discontinuities are formed in the encapsulation region of the package regions, a cavity structure is formed on the encapsulation region of the package regions, a die is attached to the die region of the package regions, wire bonding the die on the package regions and attaching a cover to the cavity structure in the package regions. After the packages are processed, the package strip is singulated into individual packages.

Figure 2A:
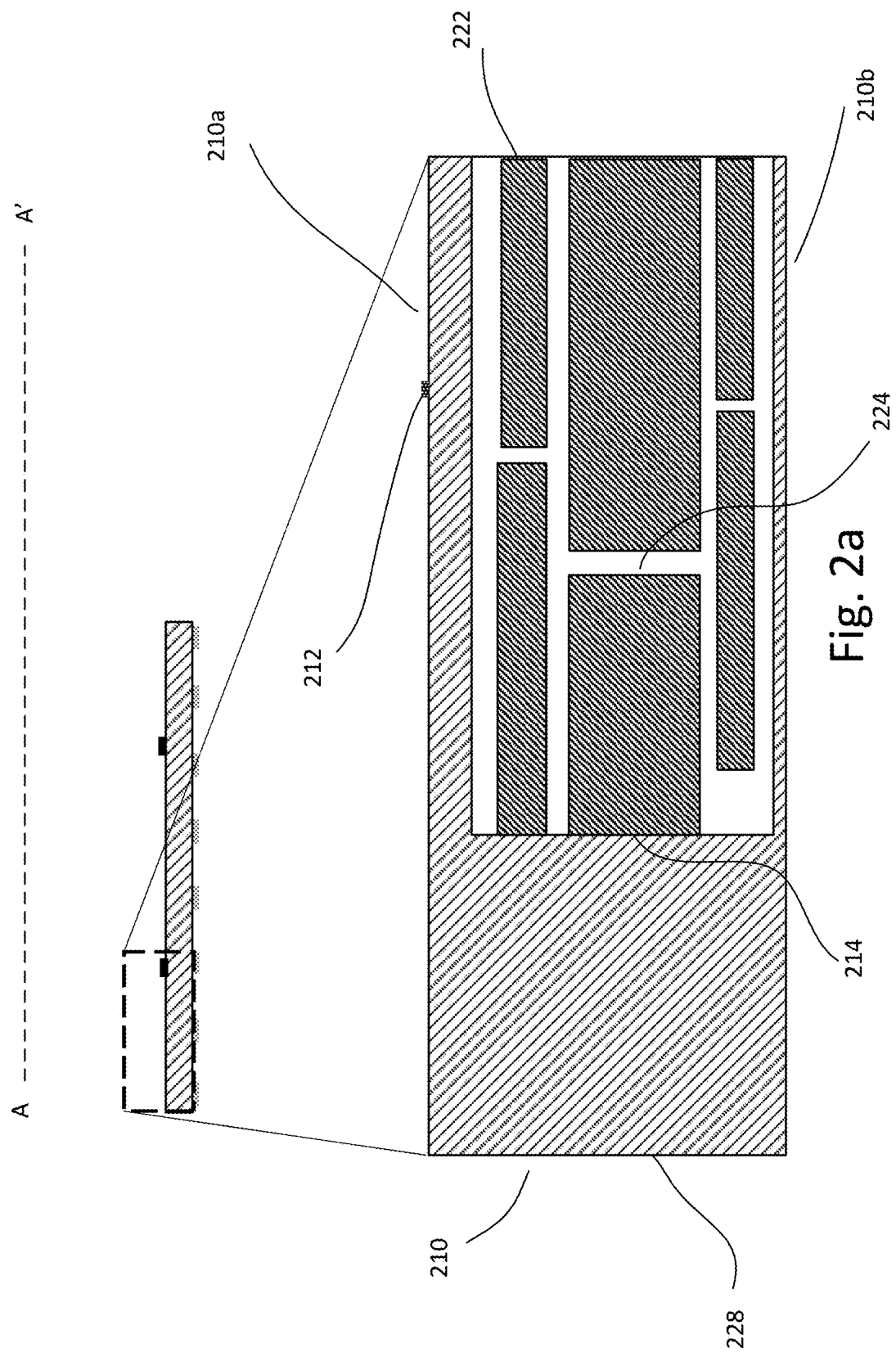
FIG. 2a shows an exemplary embodiment of a package substrate.

FIG. 2a shows an exemplary embodiment of a package substrate 210, FIGS. $2b_1$ to $2b_3$ shows various embodiments of a portion of a package substrate with recess discontinuities, and FIGS. $2c_1$ to $2c_3$ show exemplary embodiments of a package substrate with a cavity structure. The package substrate, for example, is similar to those described in FIGS. 1a to 1b. Common elements may not be described or described in detail.

Referring to FIG. 2a, a package substrate 210 is shown. The package substrate may include top and bottom package surfaces. The top package surface 210a of the package substrate may include a die region and package bond pads 212 disposed outside of the die region. A non-die region having an encapsulation region along the peripheral of the non-die region surrounds the die region. The package bond pads 212, for example, are disposed within the portion of the non-die region between the die region and the encapsulation region. The bottom package surface 210b of the package substrate may include package pads and package contacts which are interconnected to the package bond pads on the opposing surface, for example, by one or more metal layers and via contacts embedded in the package substrate. The package pads and package contacts disposed on the bottom package surface serve to electrically connect to external circuitry.

As shown, the package substrate may be a laminate substrate. In one embodiment, the package substrate includes a core package substrate having a layered stack. The layered stack, for example, includes patterned metal layers 222 forming metal traces separated by dielectric layers 224. Metal traces of adjacent metal layers may be interconnected by via contacts disposed in the dielectric layers. The layered stack may include metal layers as the top and bottom layers. In the case that the layered stack includes more than the top and bottom patterned metal layers, the patterned metal layers between the top and bottom patterned metal layers may be referred to as intermediate patterned metal layers. As shown, the layered stack includes five patterned metal layers and three dielectric layers, with the top and bottom layers being patterned metal layers. Other configurations of the core substrate may also be useful.

The core substrate is encased by a solder mask 228. For example, the solder mask is disposed on the top and bottom patterned metal layers and sides of the core substrate. The solder mask, for example, is a polymer solder mask. Other types of solder masks may also be useful. The first package surface is defined by a first solder mask surface and the second package surface is defined by a second solder mask surface. For example, the top package surface is defined by the top solder mask surface and the bottom package surface is defined by the bottom solder surface. The top package surface may serve as a die bonding surface with a die region on which a die is attached while the bottom package surface may serve as a package bonding surface which is bonded to, for example, an external board.

In FIG. $2b_1$, recess discontinuities 211 are formed in the encapsulation region of the top package surface. Preferably, the package substrate includes a plurality of recess discontinuities. As shown, the recess discontinuity may be a trench or via which extends below the surface of the package substrate. Preferably, a recess discontinuity extends to a metal layer of the core substrate. As shown, the recess discontinuity extends to a depth of the first or top metal layer of the core substrate. Recess discontinuities may be formed by, for example, patterning the surface of the package substrate. Patterning may be achieved using various techniques, such as laser etching or drilling. Other techniques, including mask and etch techniques, may also be useful.

In one embodiment, as shown in FIG. $2b2$, an adhesive layer 213 is employed on inner surfaces of the recess discontinuity. For example, the adhesive layer may be employed on the bottom surface and sidewalls of the recess discontinuity. Other configurations of the adhesive layer may also be useful. The adhesive layer may be formed of materials such as a thermal curable or u-v curable adhesive. A curing process may be performed to permanently attach the encapsulant to the recess discontinuity. Other materials suitable for forming the adhesive layer, such as an adhesive promoter may also be useful. The adhesive layer serves to enhance the adhesion of the encapsulant to the package substrate.

In another embodiment, as shown in FIG. $2b_3$, the bottom surface of the recess discontinuity is a roughened bottom surface. For example, the bottom surface of the recess discontinuity is roughened after the recess is formed. The roughened bottom surface may also be formed when the recess is being formed. As discussed, the recess extends to a metal layer of the core substrate. In such cases, the metal layer exposed has a roughened surface. The roughened bottom surface may be formed by techniques such as laser etching or drilling. Other techniques may also be useful. The roughened bottom surface increases the contact area for adhesion, thereby enhancing the adhesion between the encapsulant and the package substrate.

In some cases, the recess discontinuities may include a roughened bottom surface with an adhesive layer thereover. Although it is preferable that the recess discontinuities are of the same type, it is understood that have the same type of recess. For example, different types of recess discontinuities may be provided on the surface of the package substrate.

In FIGS. $2c_1$ to $2c_3$, an encapsulant or cavity structure 240 is formed on the encapsulation region of the top package surface. The cavity structure covers the encapsulation region of the top package surface. In one embodiment, a bottom surface of the cavity structure is disposed on the package substrate within the defined encapsulation region. The encapsulation region leaves a portion of the non-die region exposed between the die region and the inner edges or boundaries of the encapsulation region. For example, the cavity structure surrounds the die region and having a gap in the portion of the non-die region between the encapsulation region and die region. In one embodiment, the cavity structure is configured to form a cavity for the package in which the die is disposed. For example, as shown, outer cavity structure walls of the cavity structure are aligned with sides of the package substrate and inner cavity structure walls of the cavity structure are aligned with the inner edge of the encapsulation region and form the cavity in which the die is disposed. The shape of the cavity, for example, is rectangular. Providing other shaped cavities may also be useful, depending on, for example, the shape of the encapsulation region and the inner cavity structure sidewalls.

As shown, the cavity structure includes a step shaped inner sidewall and a vertical or substantially vertical outer sidewall. The inner cavity structure sidewalls have vertical lower inner cavity structure sidewalls and vertical upper inner cavity structure sidewalls which are recessed from the lower inner cavity structure sidewalls.

The cavity structure may be formed using a mold compound, such as an epoxy mold compound. Other types of materials for forming the cavity structure may also be useful. The cavity structure may be formed by various techniques, such as compression molding, injection molding, or transfer molding. Other techniques may also be useful. For example, the cavity structure may be performed and attached to the package substrate using a mold compound adhesive or formed directly on the package substrate. The mold compound adhesive, for example, may be a thermal or u-v curable adhesive. Other types of adhesives may also be useful.

FIGS. 3a to 3c show top views of various embodiments of a package substrate with discrete recess discontinuities. The package substrate with the discrete recess discontinuities is similar to those described in FIGS. 1a to 1b, 2a, $2b_1$ to $2b_3$ and $2c_1$ to $2c_3$. As such, common elements may not be described or described in detail.

As shown, a top surface 310a of the package substrate includes package bond pads 312. The package bond pads, in one embodiment, are disposed in the portion of the non-die region between the die region and the encapsulation region. As shown, the die bond pads are arranged in a row surrounding the sides of the die region. Other package pad arrangements may also be useful.

In one embodiment, the encapsulation region of the top package substrate surface is configured with a plurality of discrete recess discontinuities 311. The discrete recess discontinuities, for example, may be recess discontinuities which extend below the surface of the package substrate. Preferably, the recess discontinuities extend to a metal layer of the core substrate. The recess may include a roughened or an unroughened bottom surface, be lined or unlined with an adhesive or a combination of a roughened bottom surface and lined with an adhesive, such as those described in FIGS. $2b_1$ to $2b_3$. The recess discontinuities may be distributed in the encapsulation region of the top package substrate surface. The distribution pattern may be a regular or an irregular distribution pattern. The top view of the recess discontinuities can have any geometric shape, including regular or irregular geometric shapes As shown in FIG. 3a, the recess discontinuities 311 have an x or a cross shape. The discontinuities are configured in a single row on each side of the package substrate. The discontinuities may be evenly spaced apart. For example, the discontinuities are distributed in the encapsulation region with a regular distribution pattern. Other distribution patterns may also be useful. Also, as shown, the discontinuities have the same shape. Providing discontinuities with different shapes may also be useful.

Referring to FIG. 3b, the recess discontinuities 311 have a circular or oval shape. The discontinuities are configured in a dual row on each side of the package substrate. The discontinuities in each row are evenly spaced apart but are staggered with respect to the other row. For example, the discontinuities are distributed in the encapsulation region with a regular distribution pattern. Other distribution patterns may also be useful. Also, as shown, the discontinuities have the same shape. Providing discontinuities with different shapes may also be useful.

In FIG. 3c, the recess discontinuities 311 have an angular shape. The discontinuities are configured in a single row on each side of the package substrate. The discontinuities in each row are evenly spaced apart but adjacent discontinuities are pointed in opposing directions. For example, the discontinuities are distributed in the encapsulation region with a regular distribution pattern. Other distribution patterns may also be useful. Also, as shown, the discontinuities have the same shape. Providing discontinuities with different shapes may also be useful.

FIGS. $4a_1$ to $4a_5$ show cross-sectional views of various embodiments of cavity packages 400. The cavity packages are similar to those described in FIGS. 1a to 1b, 2a, $2b_1$ to $2b_3$, $2c_1$ to $2c_3$ and 3a to 3c. Common elements may not be described or described in detail.

As shown, a top surface of the package substrate includes package bond pads 412. The package bond pads, in one embodiment, are disposed in the portion of the non-die region between the die region and the encapsulation region. As shown, the die bond pads are arranged in a row surrounding the sides of the die region. Other package pad arrangements may also be useful.

The encapsulation region of the top package substrate surface is configured with discontinuities 480. The discontinuities, as shown, are protruded discontinuities which protrude above the top package substrate surface. In one embodiment, the protruded discontinuities are anchor structures. The anchor structures may have various anchor shapes. The shape of the anchor structures may be a regular shape or an irregular shape. For example, the anchor structures may be T-shaped as shown in FIG. $4a_1$, C-shaped as shown in FIG. $4a_2$, angular T-shaped as shown in FIG. $4a_3$, Y-shaped as shown in FIG. $4a_4$ or sloping T-shaped as shown in FIG. $4a_5$. Other shapes may also be useful. As also discussed, the package substrate may include different shaped anchor structures. Other anchor shapes or configurations of anchor structures may also be useful.

In one embodiment, the anchor structures are disposed in recess discontinuities. For example, the anchor structures are disposed in discrete recess discontinuities. In other embodiments, the anchor structures may be disposed in continuous or semi-continuous recess discontinuities. The anchor structures, in one embodiment, are configured to be in communication with the top metal layer of the package substrate. In other embodiments, alternatively, the anchor structures are disposed on the surface of the package substrate and penetrate through to the top metal layer of the package substrate. Configuring the anchor structures to be in communication with other metal layers may also be useful. Furthermore, it is understood that not all anchors need to be in communication with the same metal layer.

The anchor structures may be formed of a sturdy material. For example, the shaped anchor structures may be formed of metals, such as Cu, Ni, Pd, W, or an alloy of any of these materials. Providing other sturdy materials may also be useful. The anchor structure may be formed by various techniques, such as stamping, 3D printing or molding. Other techniques for forming the anchor structures may also be useful. The anchor structures may be fitted onto the package substrate by, for example, stamping or bonding. Other techniques may also be useful. For example, the anchor structures may be pressed into the surface of the package substrate or by force fitting, such as pressing the anchor structures into small openings on the package substrate surface created for accommodating them.

The discontinuities may be distributed in the encapsulation region of the top package substrate surface. The distribution pattern may be a regular or an irregular distribution pattern. For example, the distribution patterns may be similar to those described in FIGS. 3a to 3c. Other types of distribution patterns may also be useful.

FIGS. $5a_1$ to $5a_5$ show simplified cross-sectional views of various embodiments of cavity packages 500. The cavity packages are similar to those described in FIGS. 1a to 1b, 2a, $2b_1$ to $2b_3$, $2c_1$ to $2c_3$, 3a to 3c and $4a_1$ to $4a_5$. Common elements may not be described or described in detail.

As shown, a top surface of the package substrate includes package bond pads 512. The package bond pads, in one embodiment, are disposed in the portion of the non-die region between the die region and the encapsulation region. As shown, the die bond pads are arranged in a row surrounding the sides of the die region. Other package pad arrangements may also be useful.

The encapsulation region of the top package substrate surface is configured with discontinuities 580. The discontinuities, as shown, are protruded discontinuities which protrude above the top package substrate surface. In one embodiment, the protruded discontinuities are solder structures. For example, structures formed of solder serve as protruded discontinuities in the encapsulate region of the top package substrate surface. The solder structures, in one embodiment, are disposed in recesses or openings. For example, the solder structures are disposed in recess discontinuities. The recess discontinuities may be discrete, continuous or semi-continuous. The package substrate may include the same type of discontinuities or different types of discontinuities. The recess discontinuities extend to the top metal layer of the package substrate. Extending the discontinuities to other metal layers of the package substrate may also be useful. It is also understood that not all recesses need to extend to the same metal layer of the package substrate. For example, recesses can extend to different metal layers of the package substrate.

The solder structures may be configured to completely fill the recess discontinuities or partially fill the discontinuities. Providing solder structures which completely fill and partially fill the discontinuities may also be useful. The solder structures may have various solder structure shapes. The solder structures, for example, may be solder bumps completely filling the openings as shown in FIGS. $5a_1$, solder bumps partially filling the openings as shown in FIG. $5a_2$, solder bars completely filling the openings as shown in FIG. $5a_3$, solder hooks disposed in openings as shown in FIG. 5a4, or multiple solder hooks disposed in each opening as shown in FIG. $5a_5$. Other solder structure shapes may also be useful. It is understood that the package substrate may include different types of solder structures.

The solder structures may be formed by solder bump technology (SBT). SBT, for example, may include solder drop and reflow to form the solder structures. Other techniques, such as a pressed-in process for pre-formed solder structures, may also be useful.

The discontinuities may be distributed in the encapsulation region of the top package substrate surface. The distribution pattern may be a regular or an irregular distribution pattern. For example, the distribution patterns may be similar to those described in FIGS. 3a to 3c. Other types of distribution patterns may also be useful.

FIG. 6 shows an exemplary process 600 of forming various embodiments of a semiconductor package. In particular, FIG. 6a shows an exemplary process of forming a semiconductor package formed with recess discontinuities, while FIG. 6b shows an exemplary process of forming a semiconductor package formed with protruded structures disposed in recess discontinuities. The package may be similar to those described in FIGS. 1a to 1b. Common elements may not be described or described in detail.

The process begins by providing a package substrate at 610. The package substrate may include top and bottom package surfaces. The top package surface of the package substrate may include a die attach region and package bond pads disposed outside of the die attach region. The bottom package surface of the package substrate may include package pads which are interconnected to the package bond pads on the opposing surface, for example, by one or more metal layers and via contacts embedded in the package substrate.

The package substrate, in one embodiment, is a laminate package substrate. Other types of package substrates may also be useful. The package substrate includes a core package substrate having a layered stack. The layered stack, for example, includes patterned metal layers forming metal traces separated by dielectric layers. Metal traces of adjacent metal layers may be interconnected by via contacts disposed in the dielectric layers. The layered stack may include metal layers as the top and bottom layers. In the case that the layered stack includes more than two patterned metal layers, other patterned layers may be referred to as intermediate patterned metal layers. As shown, the layered stack includes five patterned metal layers and three dielectric layers, with the top and bottom layers being patterned metal layers. Other configurations of the core substrate may also be useful.

The core substrate, in one embodiment, is encased by a solder mask. For example, the solder mask is disposed on the top and bottom patterned metal layers and sides of the core substrate. The solder mask, for example, is a polymer solder mask. Other types of solder masks may also be useful. The first package surface is defined by a first solder mask surface and the second package surface is defined by a second solder mask surface. For example, the top package surface is defined by the top solder mask surface and the bottom package surface is defined by the bottom solder surface. The top package surface may serve as a die bonding surface with a die region on which a die is attached while the bottom package surface may serve as a package bonding surface which is bonded to, for example, an external circuit board.

The top package surface may be defined with a die region. Surrounding the die region is a non-die region. An encapsulation region is defined in a peripheral portion of the non-die region. For example, the die region may be centrally disposed within the top package surface with the non-die region surrounding it. Providing a die region which is not centrally disposed within the top package surface may also be useful.

The encapsulation region of the top package surface includes one or more cavity interlocks. Preferably, the package substrate includes a plurality of interlocks. The cavity interlocks are configured to improve the adhesion of the cavity structure to the package substrate. For example, the cavity interlocks are configured to prevent delamination of the cavity structure from the package substrate. In one embodiment, an interlock is a discontinuity on the surface of the package substrate. For example, the interlock is a discontinuity on the polymer solder mask encasing the core substrate. The discontinuity may be a recessed discontinuity, such as a trench or via which extends below the surface of the package substrate, a protruded discontinuity, such as a structure which protrudes above the surface of the package substrate, or a combination thereof.

Preferably, a recess discontinuity extends to a metal layer of the core substrate. For example, the recess discontinuity extends to a depth of the first or top metal layer of the core substrate. Recess discontinuities may be formed by, for example, patterning the surface of the package substrate. Patterning may be achieved using various techniques, such as laser etching or drilling. Other techniques, including mask and etch techniques, may also be useful. For protruded discontinuities, the protruded structures may be pressed into the surface of the package substrate. As for combination discontinuities, recesses may be formed and protruded structures are pressed into the recesses.

In one embodiment, the cavity interlocks may be discrete discontinuities. For example, the discrete discontinuity is an isolated discontinuity. In the case of a discrete recessed discontinuity, an isolated recess may have a rectangular shape, a square shape, or circular shape, or any polygonal shaped recess.

In one embodiment, the cavity interlocks are recessed discontinuities. For example, the discontinuities may be discrete trenches or vias distributed throughout the surface of the package substrate within the encapsulation region. The distribution can have any pattern on the package substrate surface. For example, the distribution may have a regular or an irregular pattern. A regular pattern, for example, may include a row of discrete discontinuities on all four sides surrounding the die region, multiple rows of discrete discontinuities on all four sides surrounding the die region with aligned or staggered columns while an irregular pattern may include discontinuities arranged in a random distribution pattern. Other distribution patterns for the cavity interlocks may also be useful.

In some cases, a cavity interlock may be configured as a continuous discontinuity. For example, a cavity interlock may be a ringed discontinuity, such as a recessed discontinuity, a ringed protruded discontinuity or a combination thereof, which completely and continuously surrounds the die region 102. This is in contrast to discrete discontinuities which are configured to discontinuously surround the die region. The ringed shape continuous discontinuity may be regular or irregular in shape. For example, regular shapes include circles, ellipses, squares, rectangles, and polygons while irregular shapes may include any odd shaped ring structures. In other embodiments, multiple continuous ring shaped discontinuities may be provided. For example, concentric rings, regular or irregular shaped, may be provided. Furthermore, rings need not have the same shape.

In yet other embodiments, the cavity interlocks may be configured as semi-continuous discontinuities. Semi-continuous discontinuities, in one embodiment, are elongated discontinuities. Similar to discrete discontinuities, they do not continuously surround the die region. However, by being elongated, they require fewer discontinuities to surround the die region than discrete discontinuities. The discontinuities may be distributed in any pattern on the surface of the package substrate. In some embodiments, the pattern of the distribution of discontinuities may include discrete discontinuities, semi-continuous discontinuities, continuous discontinuity or discontinuities or a combination thereof.

In one embodiment, an adhesive layer is employed on the inner surfaces of the recess discontinuity. For example, the adhesive layer may be employed on the bottom surface and sidewalls of the recess discontinuity. Other configurations of the adhesive layer may also be useful. The adhesive layer may be formed of materials such as a thermal curable or u-v curable adhesive. A curing process may be performed to permanently attach the encapsulant to the recess discontinuity. Other materials suitable for forming the adhesive layer, such as an adhesive promoter may also be useful. The adhesive layer serves to enhance the adhesion of the encapsulant to the package substrate.

In another embodiment, the bottom surface of the recess discontinuity is a roughened bottom surface. For example, the bottom surface of the recess discontinuity is roughened after the recess is formed. The roughened bottom surface may also be formed when the recess is being formed. As discussed, the recess extends to a metal layer of the core substrate. In such cases, the metal layer exposed has a roughened surface. The roughened bottom surface may be formed by techniques such as laser etching or drilling. Other techniques may also be useful. The roughened bottom surface increases the contact area for adhesion, thereby enhancing the adhesion between the encapsulant and the package substrate.

In some cases, the recess discontinuities may include a roughened bottom surface with an adhesive layer thereover. Although it is preferable that the recess discontinuities are of the same type, it is understood that have the same type of recess. For example, different types of recess discontinuities may be provided on the surface of the package substrate.

The process continues to 620 after the processing of recess discontinuities is completed. An encapsulant or cavity structure is disposed on the encapsulation region of the top package surface of the package substrate. The cavity structure covers the encapsulation region of the top package surface of the package substrate. In one embodiment, a bottom surface of the cavity structure is disposed on the package substrate within the defined encapsulation region. As discussed, the encapsulation region leaves a portion of the non-die region exposed between the die region and the inner edges or boundaries of the encapsulation region. For example, the cavity structure surrounds the die region and having a gap in the portion of the non-die region between the encapsulation region and die region. In one embodiment, the cavity structure is configured to form a cavity for the package in which the die is disposed. For example, as shown, outer cavity structure walls of the cavity structure are aligned with sides of the package substrate and inner cavity structure walls of the cavity structure are aligned with the inner edge of the encapsulate region and form the cavity in which the die is disposed. The shape of the cavity, for example, is rectangular. Providing other shaped cavities may also be useful, depending on, for example, the shape of the encapsulate region and the inner cavity structure sidewalls.

In one embodiment, the cavity structure is configured to accommodate a protective cover or cap. In one embodiment, the inner cavity structure walls include a stepped profile for accommodating the protective cover. For example, the outer cavity structure sidewalls are vertical sidewalls while the inner sidewalls have vertical lower inner cavity structure sidewalls and vertical upper inner cavity structure sidewalls which are recessed from the lower inner cavity structure sidewalls.

The cavity structure may be formed using a mold compound, such as an epoxy mold compound. Other types of materials for forming the cavity structure may also be useful. The cavity structure may be formed by various techniques, such as compression molding, injection molding, or transfer molding. Other techniques may also be useful. For example, the cavity structure may be performed and attached to the package substrate using a mold compound adhesive or formed directly on the package substrate. The mold compound adhesive, for example, may be a thermal or u-v curable adhesive. Other types of adhesives may also be useful.

At 630, a die is attached to the die region, for example, by a die adhesive. The die adhesive may be an adhesive tape disposed on the die region. A curing process may be performed to permanently attach the die to the die region. The bottom surface or inactive surface of the die, for example, faces the die region. In one embodiment, the active die surface includes a sensor region (not shown). Depending on the application of the die, the sensor region may include a sensor or an array of sensors. The top or active die surface may include die bond pads (not shown) including dummy bond pads disposed outside of the sensor region. For example, the die bond pads may be disposed on the non-sensor region of the active surface of the die.

Wire bonds are completed between the die and package bond pads. For example, the die bond pads are disposed outside of the sensor region. Providing other arrangements for the die bond pads and the wire bonds may also be possible.

A protective cover is attached to the cavity structure at 640. In one embodiment, the protective cover is diced from a cover substrate on which a plurality of protective covers are formed. The protective cover, for example, is a glass cover. Other types of protective cover may also be useful.

The protective cover, for example, is disposed on the step of the inner cavity structure sidewalls. The protective cover includes first or top and second or bottom opposing cover surfaces with side surfaces or edges. The bottom cover surface, for example, is facing the die. The protective cover, for example, may be a glass cover which enables light to penetrate to the sensor region. Other types of protective covers may also be useful. For example, the protective cover may depend on the type of sensor. As shown, the top protective cover surface is about coplanar with the top surface of the cavity structure while the side protective layer surfaces abut the upper inner cavity structure sidewalls. Providing other configurations of the protective cover and sidewall profiles of the cavity structure may also be useful.

A cover adhesive may be employed to attach the protective cover to the cavity structure. The cover adhesive is disposed on the step of the cavity structure. The cover adhesive may be a thermal or u-v curable adhesive. For example, a curing process may be performed to permanently attach the cover to the cavity structure, hermetically sealing the cavity to protect the sensor of the die.

In one embodiment, the cavity structure with the protective cover is configured to form a cavity with a predetermined cavity height. For example, the cavity height is the distance between the bottom protective cover surface and the active die surface. The cavity height should be sufficient to protect various components within the cavity. For example, the cavity height should be sufficient to avoid damaging the die and wire bonds in the cavity. The cavity height, for example, may be about 120-150 um. Other cavity heights may also be useful. The height should be sufficient to protect the wire bonds from being damaged.

The process completes after the protective cover is attached to the cavity structure and the cavity is formed.

As discussed, the cavity interlock may include protruded structures. For example, the cavity interlock may be a combination of protruded structures and recess discontinuities. FIG. 6b shows a process flow for forming a semiconductor package. The semiconductor package is similar to that described in FIG. 6a. Common elements may not be described or described in detail. However, unlike FIG. 6a, a protruded structure is disposed in a recess discontinuity. For example, recesses may be formed and protruded structures are pressed into the recesses.

For example, the protruded structure may include a solder structure, such as a solder bump, a solder bar, a solder hook, multiple solder hooks or any shaped structure. In one embodiment, the protruded discontinuity may include a shaped anchor, such as a T-shaped anchor, a Y-shape anchor, a sloped T-shape anchor, or a C-shape anchor. Other types of protruded structures may also be useful. Furthermore, in the case of a plurality of discrete discontinuities, it is understood that they can be identical or non-identical.

Typically, the package substrate may include a leadframe with multiple package substrates. For example, the package substrates of the leadframe may be arranged in a matrix format, with rows and columns of package substrates. This facilitates parallel processing. For example, a plurality of dies are attached to the package substrates. After processing is completed, the leadframe is singulated, separating it into individual packages.

The inventive concept of the present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A semiconductor package comprising:
a package substrate having top and bottom major package substrate surfaces, wherein the top major package substrate surface includes a die region and an encapsulation region surrounding the die region with a gap region between the die attach region and the encapsulation region, wherein the package substrate includes
a core package substrate with alternating metal and dielectric core package substrate layers, wherein a top package substrate layer comprises a top metal package substrate layer,
a package substrate layer encasing top, bottom and side core package surfaces,
package bond pads on the top major package surface,
package contact pads on the bottom major package surface, wherein the package bond pads are connected to the package contact pads via metal traces and via contacts of the core package substrate;
a die disposed on the die region, wherein the die includes first and second major die surfaces, the second major die surface is attached to the die region, wherein die bond pads of the die are electrically connected to the package bond pads;
at least one encapsulation interlock in the encapsulation region, the encapsulant interlock penetrates through the package substrate layer encasing the core package substrate to at least the top core substrate surface;
a cavity structure, the cavity structure includes top and bottom surfaces, outer structure sidewalls defining external sidewalls of the package and inner structure sidewalls defining a cavity of the cavity structure, wherein the bottom surface of the cavity structure is disposed on the encapsulation region of the package substrate, the cavity structure encases the at least one encapsulation interlock, wherein the encapsulation interlock prevents delamination of the cavity structure from the package substrate; and
a protective cover disposed on the cavity structure, wherein the protective cover and the cavity structure form a hermetic cavity with a predetermined cavity height over the die.

2. The semiconductor package in claim 1, wherein the encapsulant interlock comprises a recess structure within the encapsulation region which extends through the package substrate layer to expose the core package substrate, wherein the cavity structure fills the recess structure.

3. The semiconductor package in claim 2, wherein the recess structure is lined with an adhesive layer.

4. The semiconductor package in claim 2, wherein the recess structure comprises a processed inner recess surface, wherein the processed inner recess surface comprises a roughened inner recess surface.

5. The semiconductor package in claim 1, wherein the encapsulation interlock comprises a protruded structure, wherein the protruded structure extends from the core package substrate and above the package substrate layer, a portion of the protruded structure above the package substrate layer is encased by the cavity structure.

6. The semiconductor package in claim 5, wherein the protruded structure comprises an anchor-shaped structure to anchor the cavity structure to the package substrate.

7. The semiconductor package in claim 5, wherein the portion of the protruded structure above the package substrate layer comprises a solder structure to anchor the cavity structure to the package substrate.

8. The semiconductor package in claim 1, wherein the encapsulation interlock comprises a recess structure and a protruded structure disposed within the recess structure, the cavity structure fills the recess structure and encases the protruded structure.

9. The semiconductor package in claim 8, wherein the protruded structure comprises an anchor-shaped structure to anchor the cavity structure to the package substrate.

10. The semiconductor package in claim 1, wherein the at least one encapsulation interlock comprises a plurality of encapsulant interlocks, wherein the encapsulation interlocks comprise recess structures, protruded structures, wherein the protruded structures are disposed within the recessed structures, or a combination thereof.

11. The semiconductor package of claim 10, wherein the encapsulation interlocks comprise continuous concentric encapsulation interlocks in the encapsulation region.

12. The semiconductor package of claim 1, wherein the cavity structure comprises a molded compound.

13. The semiconductor package of claim 1, wherein the cavity structure comprises a cured adhesive.

14. A semiconductor package comprising:
a package substrate having top and bottom major package substrate surfaces, wherein the top major package substrate surface includes a die region and an encapsulation region surrounding the die region with a gap region between the die attach region and the encapsulation region, wherein the package substrate includes
a core package substrate, and
a package substrate layer encasing top, bottom and side core package surfaces;
encapsulation interlocks in the encapsulation region, the encapsulation interlocks penetrate through the package substrate layer encasing the core package substrate to the core package substrate;
a cavity structure, the cavity structure includes top and bottom cavity structure surfaces, outer cavity structure sidewalls defining external sidewalls of the package and inner cavity structure sidewalls defining a cavity of the cavity structure, wherein the bottom cavity structure surface is disposed on the encapsulation region, the cavity structure encases the encapsulation interlocks, wherein the encapsulation interlocks prevent delamination of the cavity structure from the package substrate; and wherein the cavity structure is configured to accommodate a protective cover to produce a hermetic cavity when a die is attached to the die attach region.

15. The semiconductor package in claim 14, wherein the encapsulant interlocks comprise recess structures within the encapsulation region which extends through the package substrate layer to expose the core package substrate, wherein the cavity structure fills the recess structures.

16. The semiconductor package in claim 15, wherein the recess structures include a processed inner recess surface, the processed inner surface comprises:
   an adhesive layer lining the processed inner recess surface;
   a roughened surface; or
   a combination thereof.

17. The semiconductor package in claim 15, wherein the encapsulation interlocks comprise protruded structures, wherein the protruded structures extend from the core package substrate and above the package substrate layer, a portion of the protruded encapsulation interlock above the package substrate layer is encased by the cavity structure.

18. The semiconductor package in claim 17, wherein the protruded structures comprise:
   anchor-shaped structures to anchor the cavity structure to the package substrate;
   solder structures; or
   a combination thereof.

19. The semiconductor package of claim 14, wherein the encapsulant interlocks comprise:
   recess structures within the encapsulation region which extends through the package substrate layer to expose the core package substrate, wherein the cavity structure fills the recess structures;
   protruded structures, wherein the protruded structures extend from the core package substrate and above the package substrate layer, a portion of the protruded encapsulation interlock above the package substrate layer is encased by the cavity structure;
   protruded structures disposed within recessed structures; or
   a combination thereof.

20. The semiconductor package of claim 14, wherein the core package substrate comprises alternating metal and dielectric core package substrate layers, wherein a top package substrate layer comprises a top metal package substrate layer.

* * * * *